(12) United States Patent
Kumazawa et al.

(10) Patent No.: US 8,867,019 B2
(45) Date of Patent: Oct. 21, 2014

(54) PROJECTION OPTICAL SYSTEM, EXPOSURE APPARATUS, EXPOSURE METHOD, DISPLAY MANUFACTURING METHOD, MASK, AND MASK MANUFACTURING METHOD

(71) Applicant: Nikon Corporation, Tokyo (JP)

(72) Inventors: Masato Kumazawa, Sagamihara (JP); Tatsuo Fukui, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/627,526

(22) Filed: Sep. 26, 2012

(65) Prior Publication Data

US 2013/0021589 A1    Jan. 24, 2013

Related U.S. Application Data

(63) Continuation of application No. 12/190,260, filed on Aug. 12, 2008, now Pat. No. 8,305,556, which is a continuation of application No. PCT/JP2007/051974, filed on Feb. 6, 2007.

(30) Foreign Application Priority Data

Feb. 16, 2006   (JP) ................................ 2006-039446
Jan. 25, 2007   (JP) ................................ 2007-014631

(51) Int. Cl.
*G03B 27/44*   (2006.01)
*G03B 27/00*   (2006.01)
*G03B 27/42*   (2006.01)
*G03F 7/20*    (2006.01)
*G03F 9/00*    (2006.01)
*G02B 17/08*   (2006.01)
*G03F 1/00*    (2012.01)

(52) U.S. Cl.
CPC ........ *G02B 17/0804* (2013.01); *G03F 7/70791* (2013.01); *G03F 1/144* (2013.01); *G03F 9/7084* (2013.01); *G03F 7/70275* (2013.01)
USPC ................................. 355/54; 355/57; 355/53

(58) Field of Classification Search
USPC ........... 355/53, 67, 77, 46, 49, 54, 57, 60, 65, 355/66, 45
See application file for complete search history.

(56) References Cited

U.S. PATENT DOCUMENTS 5,625,436 A  *  4/1997  Yanagihara et al. ............ 355/53
5,715,037 A     2/1998  Saiki et al.
(Continued)

FOREIGN PATENT DOCUMENTS

JP    A-8-250399    9/1996
JP    A-11-231549   8/1999
(Continued)

OTHER PUBLICATIONS

English translation of [JP 2004-335864].*

(Continued)

*Primary Examiner* — Peter B Kim
*Assistant Examiner* — Deoram Persaud
(74) *Attorney, Agent, or Firm* — Oliff PLC

(57) ABSTRACT

An exposure apparatus of the present invention is an exposure apparatus for, while moving a first object M and a second object P along a scanning direction, performing projection exposure on the second object, which has a first projection optical system PL10 for forming an enlargement image of a portion on the first object in a first region being a partial region on the second object, and a second projection optical system PL11 for forming an enlargement image of a different portion from the portion on the first object in a second region different from the partial region on the second object, and which also has a first stage MST holding the first object and making at least one of the portion and the different portion of the first object movable along the non-scanning direction, wherein the first region and the second region are arranged at a predetermined interval along the non-scanning direction intersecting with the scanning direction.

23 Claims, 21 Drawing Sheets

(56) References Cited

U.S. PATENT DOCUMENTS

| | | | |
|---|---|---|---|
| 6,157,497 A * | 12/2000 | Kumazawa | 359/727 |
| 6,351,305 B1 | 2/2002 | Tanaka et al. | |
| 6,480,262 B1 | 11/2002 | Tanaka et al. | |
| 6,509,954 B1 | 1/2003 | Tanaka et al. | |
| 6,512,573 B2 | 1/2003 | Furter | |
| 6,515,734 B1 | 2/2003 | Yamada et al. | |
| 6,556,278 B1 | 4/2003 | Tanaka et al. | |
| 6,795,169 B2 | 9/2004 | Tanaka et al. | |
| 6,853,441 B2 * | 2/2005 | Kobayashi et al. | 355/55 |
| 6,898,025 B2 | 5/2005 | Takeuchi et al. | |
| 7,023,527 B2 | 4/2006 | Tanaka et al. | |
| 7,088,425 B2 | 8/2006 | Tanaka et al. | |
| 7,372,543 B2 | 5/2008 | Tanaka et al. | |
| 7,372,544 B2 | 5/2008 | Tanaka et al. | |
| 8,159,649 B2 * | 4/2012 | Kato | 355/53 |
| 2002/0005940 A1 * | 1/2002 | Hatada et al. | 355/55 |
| 2002/0039180 A1 | 4/2002 | Furter | |
| 2004/0160592 A1 * | 8/2004 | Iwanaga | 355/72 |
| 2004/0233405 A1 | 11/2004 | Kato et al. | |
| 2006/0055907 A1 | 3/2006 | Kato et al. | |
| 2009/0009735 A1 * | 1/2009 | Kato | 355/46 |

FOREIGN PATENT DOCUMENTS

| | | |
|---|---|---|
| JP | A-11-265848 | 9/1999 |
| JP | A-2000-331909 | 11/2000 |
| JP | A-2001-109169 | 4/2001 |
| JP | A-2001-168003 | 6/2001 |
| JP | B2-3348467 | 11/2002 |
| JP | A-2004-327660 | 11/2004 |
| JP | A-2004-335864 | 11/2004 |
| JP | A-2005-24941 | 1/2005 |
| JP | A-2005-39211 | 2/2005 |

OTHER PUBLICATIONS

International Preliminary Report on Patentability of PCT/JP2007/051974 mailed Aug. 28, 2008 and Translation of Written Opinion of the International Searching Authority.

Sep. 25, 2009 Office Action issued in Chinese Application No. 2007800055642 (w/ English-language translation).

May 1, 2007 International Search Report issued in PCT/JP2007/051974.

Nov. 10, 2011 Office Action issued in U.S. Appl. No. 12/190,260.

Mar. 13, 2012 Office Action issued in Japanese Patent Application No. 2008-500449 (w/ English-language translation).

Jun. 22, 2012 Notice of Allowance issued in U.S. Appl. No. 12/190,260.

Office Action dated Feb. 25, 2014 issued in Japanese Patent Application No. 2013-080572 (with translation).

* cited by examiner

PROJECTION OPTICAL SYSTEM, EXPOSURE APPARATUS, EXPOSURE METHOD, DISPLAY MANUFACTURING METHOD, MASK, AND MASK MANUFACTURING METHOD

CROSS-REFERENCE TO RELATED APPLICATIONS

This is a continuation application of U.S. patent application Ser. No. 12/190,260, filed on Aug. 12, 2008, which claims priority from PCT application No. PCT/JP2007/051974 filed on Feb. 6, 2007, claiming the benefit of priorities from Japanese Patent application No. 2006-039446 filed on Feb. 16, 2006 and Japanese Patent application No. 2007-014631 filed on Jan. 25, 2007, and incorporated by reference in their entirety.

TECHNICAL FIELD

The present invention relates to a projection optical system for projecting an image of a mask, a reticle, or the like onto a substrate or the like, an exposure apparatus with the projection optical system, an exposure method using the exposure apparatus, a display manufacturing method using the exposure apparatus, a mask, and a mask manufacturing method.

BACKGROUND ART

For example, semiconductor devices, liquid-crystal display devices, or the like are manufactured using a projection exposure apparatus for projecting a pattern of a mask (reticle, photo-mask, or the like) through a projection optical system onto a plate (glass plate, semiconductor wafer, or the like) coated with a resist. The conventional projection exposure apparatus frequently used was one (stepper) for implementing one-shot exposure of a pattern of a reticle in each of shot areas on a plate by the step-and-repeat method. Recently suggested is the projection exposure apparatus of the step-and-scan method having a plurality of small partial projection optical systems with a magnification of 1× arranged in two or more rows at a predetermined interval along a scanning direction, instead of one large projection optical system, and adapted to project patterns of a mask onto a plate through the respective partial projection optical systems to effect exposure thereof, while scanning the mask and the plate relative thereto (cf. Japanese Patent Application No. 5-161588).

DISCLOSURE OF THE INVENTION

Incidentally, the plate is increasing its size in recent years and the plate over 2 m×2 m has been used. When the above-described exposure apparatus of the step-and-scan method is used to implement exposure on the large-size plate, the mask also has a large size because the partial projection optical systems have the magnification of 1×. The larger the size, the higher the cost of the mask becomes because it is also necessary to maintain flatness of a mask substrate. In addition, since masks for four to five layers are needed to form an ordinary TFT part, considerable cost was required.

An object of the present invention is to provide a projection optical system with an enlargement magnification and with good optical performance, an exposure apparatus with the projection optical systems, an exposure method using the exposure apparatus, and a display manufacturing method using the exposure apparatus. Another object of the present invention is to provide a mask used in an exposure apparatus with projection optical systems having an enlargement magnification, and a manufacturing method thereof.

A first aspect of the present invention provides an exposure apparatus for, while moving a first object and a second object along a scanning direction, performing projection exposure on the second object, the exposure apparatus comprising: a first projection optical system for forming an enlargement image of a portion on the first object in a first region being a partial region on the second object; a second projection optical system for forming an enlargement image of a different portion from the portion on the first object in a second region different from the partial region on the second object; and a first stage holding the first object and making at least one of the portion and the different portion of the first object movable along a non-scanning direction; wherein the first region and the second region are arranged at a predetermined interval along the non-scanning direction intersecting with the scanning direction.

A second aspect of the present invention provides an exposure apparatus for performing projection exposure while scanning a first object and a second object relative to a projection optical apparatus, the exposure apparatus comprising: a first stage holding the first object; and a second stage holding the second object; wherein the projection optical apparatus comprises a plurality of projection optical systems arranged along a non-scanning direction intersecting with a scanning direction and each having an enlargement magnification; wherein a plurality of projection exposures are carried out while the first and second stages are moved at a speed ratio according to a ratio of the enlargement magnification and along the scanning direction and wherein the first and second stages are moved along the non-scanning direction between the plurality of projection exposures.

A third aspect of the present invention provides a projection optical system with at least one catadioptric system, wherein the catadioptric system is an optical system for projecting an image of a first plane onto a second plane, wherein the catadioptric system comprises: a concave reflecting mirror disposed in an optical path between the first plane and the second plane; a first lens unit disposed in an optical path between the first plane and the concave reflecting mirror and having a positive refracting power; a first path deflecting surface disposed in an optical path between the first lens unit and the concave reflecting mirror and adapted to deflect the optical path; a second lens unit disposed in an optical path between the first path deflecting surface and the concave reflecting mirror; a second path deflecting surface disposed in an optical path between the second lens unit and the second plane and adapted to deflect the optical path; and a third lens unit disposed in an optical path between the second path deflecting surface and the second plane and having a positive refracting power; the projection optical system satisfying the following condition:

$$1 < FPG3/FPG1 < 2.5,$$

where $FPG1$ is a focal length of the first lens unit and $FPG3$ is a focal length of the third lens unit.

A fourth aspect of the present invention provides a mask comprising a pattern region, wherein the pattern region includes a plurality of odd-line pattern regions located in odd-numbered lines along a first direction, and a plurality of even-line pattern regions located in even-numbered lines along the first direction, the mask further comprising a first measurement mark in a first positional relation with at least one of the odd-line pattern regions or at least one of the even-line pattern regions, and a second measurement mark in a second positional relation with at least one of the odd-line pattern regions or at least one of the even-line pattern regions.

A fifth aspect of the present invention provides a mask manufacturing method comprising: a step of dividing entire pattern data corresponding to all patterns to be formed on the foregoing mask, in the first direction; a step of adding pattern data corresponding to a common region, to an end in the first direction of at least one pattern data divided, to create a plurality of drawing data corresponding to the respective pattern data divided; a step of drawing the patterns on the mask, using the plurality of drawing data; and a step of creating a reference mark in a predetermined positional relation with at least one pattern out of the patterns thus drawn.

A sixth aspect of the present invention provides an exposure method for performing projection exposure while scanning a first object and a second object relative to a projection optical apparatus, the exposure method comprising: a first exposure step of, using a plurality of projection optical systems arranged along a non-scanning direction intersecting with a scanning direction, forming a plurality of exposure regions on the second object while moving the second object in the scanning direction; a stepping step of moving the second object along the non-scanning direction; and a second exposure step of, using the plurality of projection optical systems, forming a plurality of exposure regions on the second object while moving the second object in the scanning direction; wherein each of the projection optical systems is the projection optical system of the present invention, and wherein in the stepping step at least one of the plurality of exposure regions to be formed in the second exposure step is positioned between the plurality of exposure regions formed in the first exposure step.

A seventh aspect of the present invention provides an exposure method for performing projection exposure while scanning a first object and a second object relative to a projection optical apparatus, the exposure method comprising: a first exposure step of, using a plurality of projection optical systems arranged along a non-scanning direction intersecting with a scanning direction, forming a plurality of exposure regions on the second object while moving the second object in the scanning direction; a first stepping step of moving the second object along the non-scanning direction; a second exposure step of, using the plurality of projection optical systems, forming a plurality of exposure regions on the second object while moving the second object in the scanning direction; and a second stepping step of moving the second object along the non-scanning direction; wherein in the first stepping step at least one of the plurality of exposure regions to be formed in the second exposure step is positioned between the plurality of exposure regions formed in the first exposure step; and wherein in the second stepping step the second object is moved along the non-scanning direction over a width along the non-scanning direction of the plurality of exposure regions formed on the second object in the first or second exposure step.

An eighth aspect of the present invention provides a display manufacturing method comprising: an exposure step of effecting exposure of a predetermined pattern on a photosensitive substrate, using the exposure apparatus of the present invention; and a development step of developing the photosensitive substrate exposed in the exposure step.

A ninth aspect of the present invention provides a display manufacturing method comprising: an exposure step of effecting exposure of a predetermined pattern on a photosensitive substrate, using the exposure method of the present invention; and a development step of developing the photosensitive substrate exposed in the exposure step.

BEST MODES FOR CARRYING OUT THE INVENTION

Figure 1:
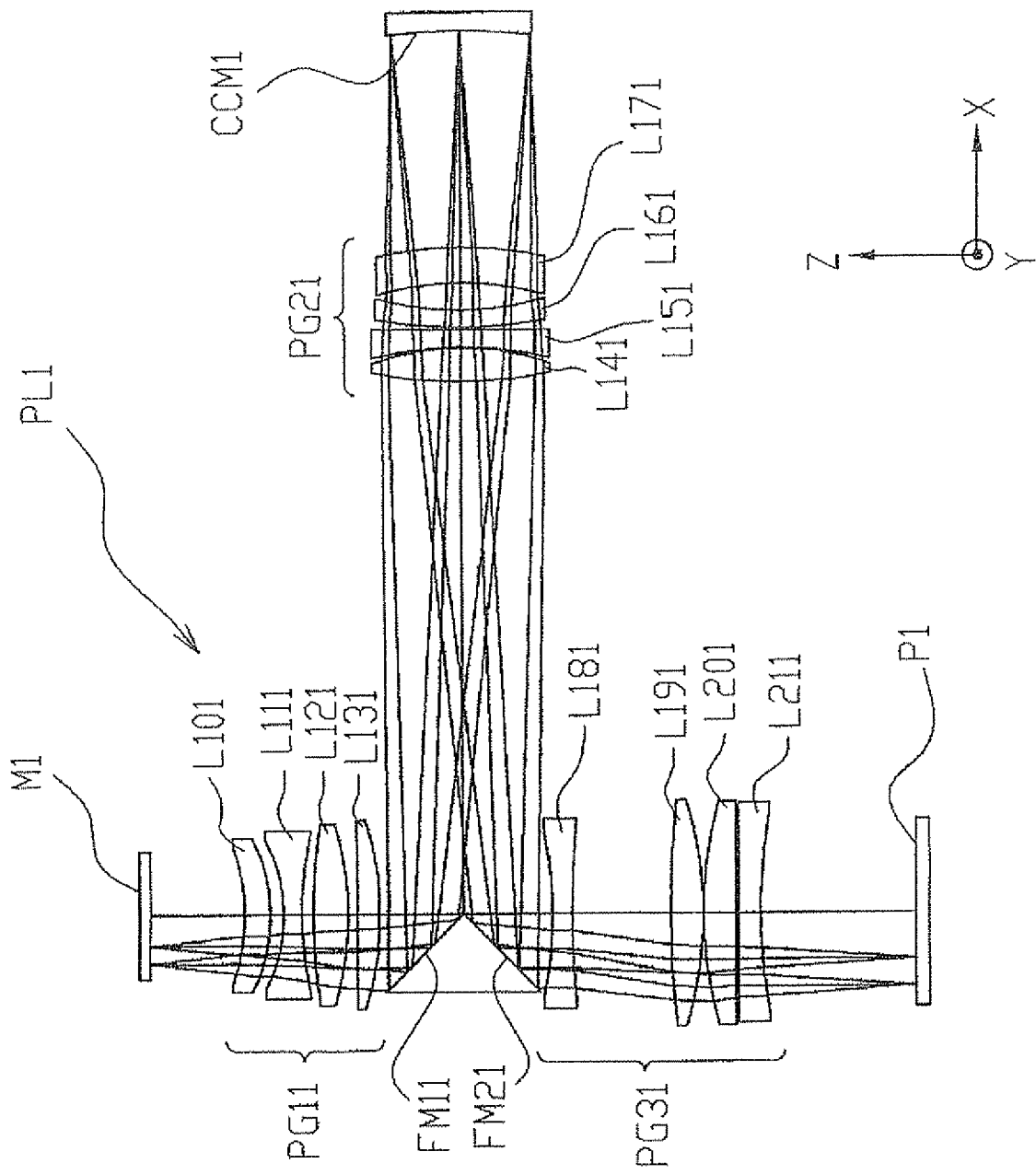
FIG. 1 is a drawing showing a configuration of a projection optical system according to the first embodiment.

The projection optical systems according to embodiments of the present invention will be described below with reference to the drawings. FIG. 1 is a drawing showing a configuration of a projection optical system according to the first embodiment. In the description hereinafter, an XYZ orthogonal coordinate system is set as shown in each drawing and positional relations among members will be described with reference to this XYZ orthogonal coordinate system. The XYZ orthogonal coordinate system is defined so that the X-axis and the Y-axis are set to be parallel to a plate P used in an exposure apparatus described later and so that the Z-axis is set to be perpendicular to the plate P. In the XYZ coordinate system in the drawings, actually, the XY plane is set as a plane parallel to the horizontal plane and the Z-axis is set along a vertically upward direction. In the after-described exposure apparatus, the X-axis direction is set along a direction of movement of mask M and plate P (scanning direction).

The projection optical system PL1 shown in FIG. 1 is a catadioptric system for projecting an image of a mask (first plane) M1 onto a plate (second plane) P1, and has the following members: concave reflecting mirror CCM1 disposed in the optical path between mask M1 and plate P1; first lens unit PG11 disposed in the optical path between mask M1 and concave reflecting mirror CCM1 and having a positive refracting power; first path deflecting surface FM11 adapted to deflect the optical path as obliquely arranged at an angle of 45° to the surface of the mask M1 so as to reflect light traveling in the −Z-axis direction from the first lens unit PG11, into the X-axis direction, in the optical path between first lens unit PG11 and concave reflecting mirror CCM1; second lens unit PG21 disposed in the optical path between first path deflecting surface FM11 and concave reflecting mirror CCM1; second path deflecting surface FM21 adapted to deflect the optical path as obliquely arranged at an angle of 45° to the surface of the mask M1 so as to reflect light traveling in the −X-axis direction from the second lens unit PG21, into the −Z-axis direction, in the optical path between second lens unit PG21 and plate P1; third lens unit PG31 disposed in the optical path between second path deflecting surface FM21 and plate P1 and having a positive refracting power.

The first lens unit PG11 in the projection optical system PL1 is composed of a positive meniscus lens L101 with a concave surface on the mask M1 side, a biconcave lens L111, a biconvex lens L121, and a planoconvex lens L131 with a plane on the mask M1 side. The second lens unit PG21 is composed of a biconvex lens L141, a negative meniscus lens L151 with a concave surface on the first path deflecting surface FM11 side, a negative meniscus lens L161 with a convex surface on the first path deflecting surface FM11 side, and a negative meniscus lens L171 with a concave surface on the first path deflecting surface FM11 side. The third lens unit PG31 is composed of a biconcave lens L181, a biconvex lens L191, a planoconvex lens L201 with a convex surface on the second path deflecting surface FM21 side, and a planoconcave lens L211 with a concave surface on the plate P1 side.

Figure 2:
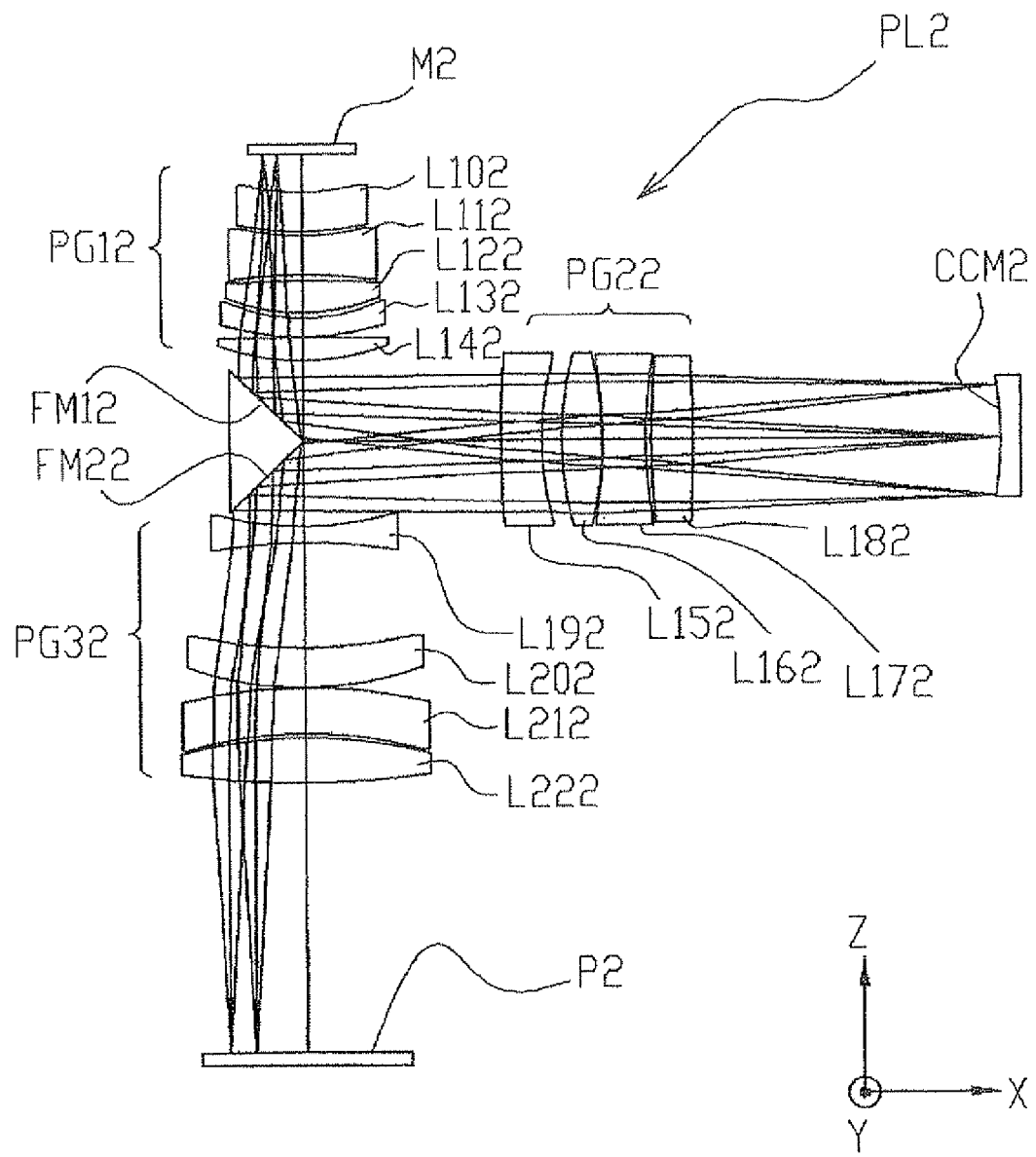
FIG. 2 is a drawing showing a configuration of a projection optical system according to the second embodiment.

Next, the projection optical system PL2 according to the second embodiment will be described with reference to FIG. 2. FIG. 2 is a drawing showing a configuration of the projection optical system PL2 according to the second embodiment.

The projection optical system PL2 shown in FIG. 2 is a catadioptric system for projecting an image of a mask (first plane) M2 onto a plate (second plane) P2, and has the following members: concave reflecting mirror CCM2 disposed in the optical path between mask M2 and plate P2; first lens unit PG12 disposed in the optical path between mask M2 and concave reflecting mirror CCM2 and having a positive refracting power; first path deflecting surface FM12 adapted to deflect the optical path as obliquely arranged at an angle of 45° to the surface of the mask M2 so as to reflect light traveling in the −Z-axis direction from the first lens unit PG12, into the X-axis direction, in the optical path between first lens unit PG12 and concave reflecting mirror CCM2; second lens unit PG22 disposed in the optical path between first path deflecting surface FM12 and concave reflecting mirror CCM2; second path deflecting surface FM22 adapted to deflect the optical path as obliquely arranged at an angle of 45° to the surface of the mask M2 so as to reflect light traveling in the −X-axis direction from the second lens unit PG22, into the −Z-axis direction, in the optical path between second lens unit PG22 and plate P2; third lens unit PG32 disposed in the optical path between second path deflecting surface FM22 and plate P2 and having a positive refracting power.

The first lens unit PG12 is composed of a negative meniscus lens L102 with a concave surface on the mask M2 side, a biconcave lens L112, a biconvex lens L122, a negative meniscus lens L132 with a concave surface on the mask M2 side, and a planoconvex lens L142 with a plane on the mask M2 side. The second lens unit PG22 is composed of a negative meniscus lens L152 with a convex surface on the first path deflecting surface FM12 side, a biconvex lens L162, a biconcave lens L172, and a biconvex lens L182. The third lens unit PG3 is composed of a biconcave lens L192, a positive meniscus lens L202 with a concave surface on the second path deflecting surface FM22 side, a negative meniscus lens L212 with a convex surface on the second path deflecting surface FM22 side, and a biconvex lens L222.

Figure 3:
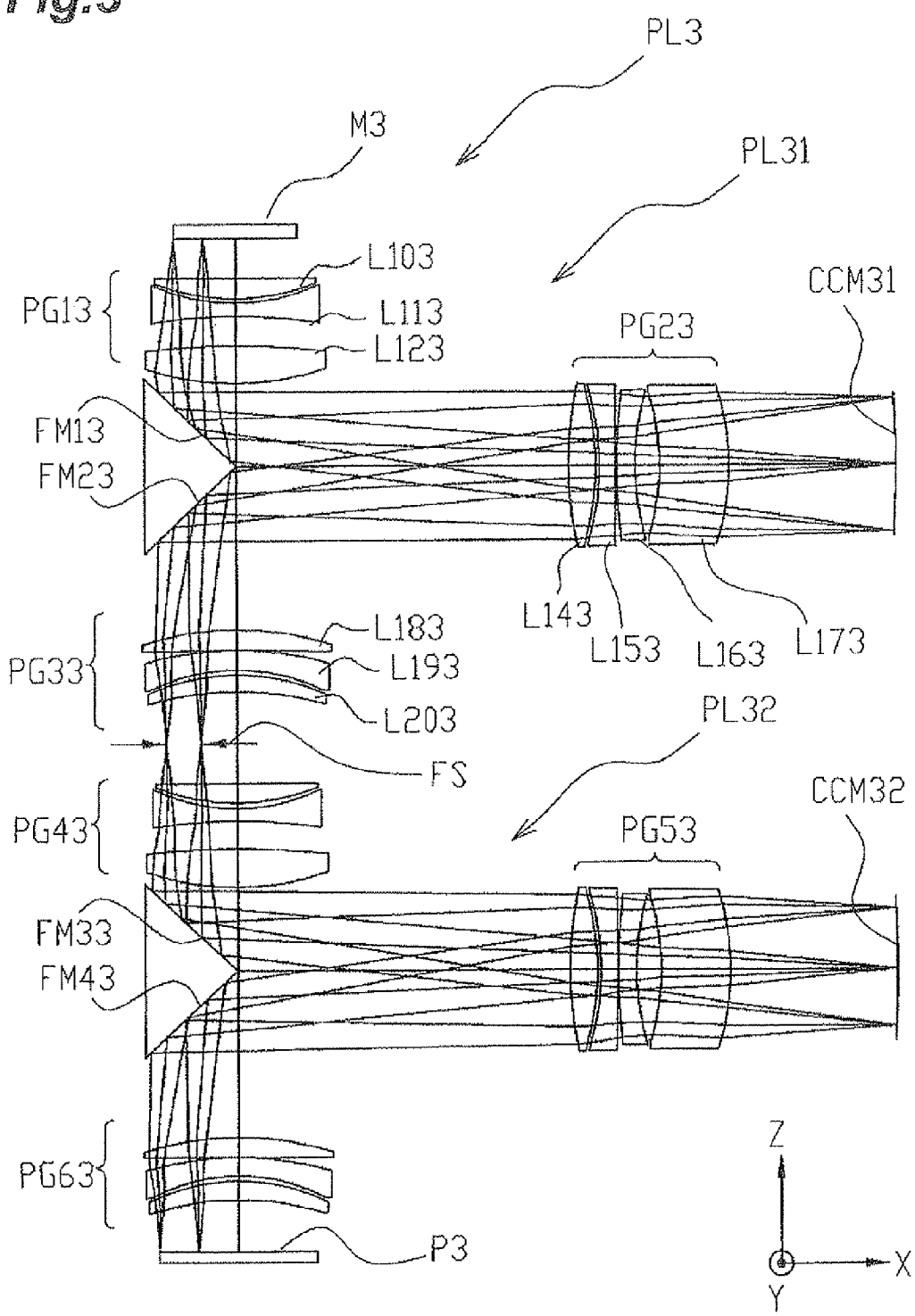
FIG. 3 is a drawing showing a configuration of a projection optical system according to the third embodiment.

Next, the projection optical system PL3 according to the third embodiment will be described with reference to FIG. 3. FIG. 3 is a drawing showing a configuration of the projection optical system PL3 according to the third embodiment.

The projection optical system PL3 shown in FIG. 3 has a catadioptric system PL31 and a catadioptric system PL32 for projecting an image of a mask (first plane) M3 onto a plate (second plane) P3. The catadioptric system PL31 has the following members: concave reflecting mirror CCM31 disposed in the optical path between mask M3 and field stop FS; first lens unit PG13 disposed in the optical path between mask M3 and concave reflecting mirror CCM31 and having a positive refracting power; first path deflecting surface FM13 adapted to deflect the optical path as obliquely arranged at an angle of 45° to the surface of the mask M3 so as to reflect light traveling in the −Z-axis direction from the first lens unit PG13, into the X-axis direction, in the optical path between first lens unit PG13 and concave reflecting mirror CCM31; second lens unit PG23 disposed in the optical path between first path deflecting surface FM13 and concave reflecting mirror CCM31; second path deflecting surface FM23 adapted to deflect the optical path as obliquely arranged at an angle of 45° to the surface of the mask M3 so as to reflect light traveling in the −X-axis direction from the second lens unit PG23, into the −Z-axis direction, in the optical path between second lens unit PG23 and field stop FS; third lens unit PG33 disposed in the optical path between second path deflecting surface FM23 and field stop FS and having a positive refracting power.

The catadioptric system PL32 has the same configuration as the catadioptric system PL31. Namely, it has the following members: concave reflecting mirror CCM32 disposed in the optical path between field stop FS and plate P3; fourth lens unit PG43 disposed in the optical path between field stop FS and concave reflecting mirror CCM32 and having a positive refracting power; third path deflecting surface FM33 adapted to deflect the optical path as obliquely arranged at an angle of 45° to the surface of the mask M3 so as to reflect light traveling in the −Z-axis direction from the fourth lens unit PG43, into the X-axis direction, in the optical path between fourth lens unit PG43 and concave reflecting mirror CCM32; fifth lens unit PG53 disposed in the optical path between third path deflecting surface FM33 and concave reflecting mirror CCM32; fourth path deflecting surface FM43 adapted to deflect the optical path as obliquely arranged at an angle of 45° to the surface of the mask M3 so as to reflect light traveling in the −X-axis direction from the fifth lens unit PG53, into the −Z-axis direction, in the optical path between fifth lens unit PG53 and plate P3; sixth lens unit PG63 disposed in the optical path between fourth path deflecting surface FM43 and plate P3 and having a positive refracting power.

The first lens unit PG13 is composed of a planoconvex lens L103 with a plane on the mask M3 side, a biconcave lens L113, and a biconvex lens L123. The second lens unit PG23 is composed of a biconvex lens L143, a negative meniscus lens L153 with a concave surface on the first path deflecting surface FM13 side, a negative meniscus lens L163 with a convex surface on the first path deflecting surface FM13 side, and a negative meniscus lens L173 with a concave surface on the first path deflecting surface FM13 side. The third lens unit PG33 is composed of a planoconvex lens L183 with a convex surface on the second path deflecting surface FM23 side, a negative meniscus lens L193 with a convex surface on the second path deflecting surface FM23 side, and a positive meniscus lens L203 with a convex surface on the second path deflecting surface FM23 side. The fourth lens unit PG43, the fifth lens unit PG53, and the sixth lens unit PG63 have the same configuration as the first lens unit PG13, the second lens unit PG23, and the third lens unit PG33, respectively.

In the first to third embodiments described above, the projection optical system satisfies the following condition:

$$1 < FPG3/FPG1 < 2.5,$$

where FPG1 is the focal length of the first lens unit PG11, PG12, or PG13 and FPG3 is the focal length of the third lens unit PG31, PG32, or PG33.

When the ratio is below the lower limit of this condition, the projection magnification is smaller than 1 and the projection optical system cannot be constructed with an enlargement magnification. When the ratio is over the upper limit, the image height becomes high on the enlargement image side and it becomes difficult to compensate for astigmatism and curvature of field.

Since each of the first lens unit PG11, PG12, or PG13 and the third lens unit PG31, PG32, or PG33 has the positive refracting power, it has two positive lenses, which facilitates compensation for spherical aberration and curvature of field.

Since the second lens unit PG21, PG22, or PG23 has at least one negative lens and one positive lens, it becomes feasible to compensate for chromatic aberration in the second lens unit PG21, PG22, or PG23. At least one negative lens and one positive lens in the second lens unit PG21, PG22, or PG23 are more preferably composed of different types of optical members. In addition to this configuration, each of the first lens unit PG11, PG12, PG13 and the third lens unit PG31, PG32, PG33 is preferably provided with a negative lens and a positive lens. This enables compensation for chromatic aberration in each lens unit, whereby good compensation for chromatic aberration can be achieved as the entire projection optical system even if exposure wavelengths range over a wider band (e.g., a wavelength band from the g-line (436 nm) to the i-line (365 nm)).

In the first and second embodiments described above, since the third lens unit PG31 or PG32 has the negative lens L181 or L192 located nearest to the second path deflecting surface FM21, FM22, it is feasible to separate view fields even for rays at low image heights and to secure a wide exposure region.

Figure 4:
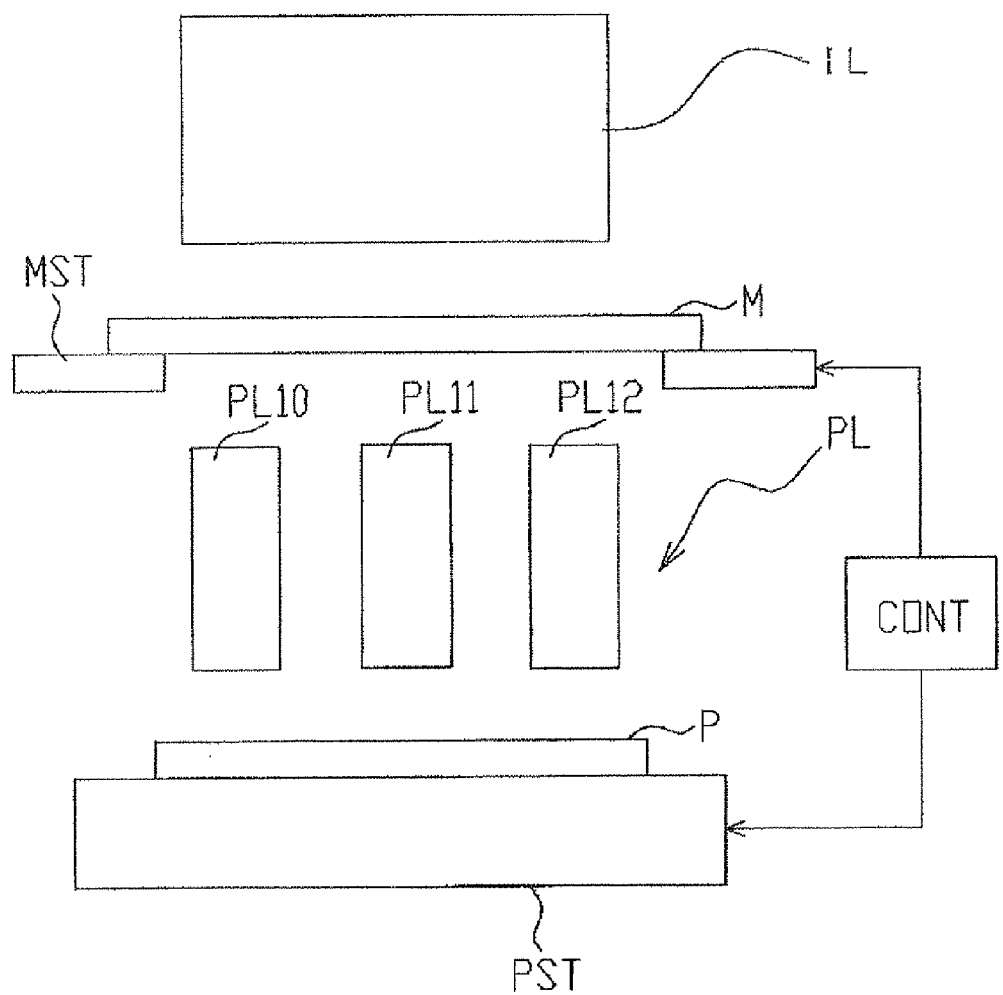
FIG. 4 is a drawing showing a configuration of an exposure apparatus according to the fourth embodiment.

An exposure apparatus according to the fourth embodiment of the present invention will be described below with reference to the drawing. FIG. 4 is a drawing showing a schematic configuration of the exposure apparatus according to the fourth embodiment. This embodiment will be described using an example of the exposure apparatus of the step-and-scan method for transferring an image of a pattern formed on a mask M (original pattern), onto a plate P while scanning the mask (first object) M and the plate (second object, photosensitive substrate) P having the outside diameter larger than 500 mm, relative to a projection optical apparatus PL with projection optical systems PL10, PL11, and PL12 each of which is composed of any one of the catadioptric projection optical systems of the first to third embodiments described above. The outside diameter larger than 500 mm herein refers to a size whose one side or diagonal line is larger than 500 mm.

The exposure apparatus according to this embodiment has an illumination optical system IL for uniformly illuminating the mask M. The illumination optical system IL has a light source, for example, consisting of a mercury lamp or an ultrahigh-pressure mercury lamp and is composed of an optical integrator, a field stop, a condenser lens, and so on. Exposure light emitted from the light source passes through the illumination optical system IL to illuminate the pattern formed in the mask M. The light passing through the mask M travels through the plurality of projection optical systems PL10, PL11, and PL12 to project the pattern of the mask M into exposure regions on the plate to effect projection exposure thereof. In this embodiment, for example, the projection optical system PL10 corresponds to the first projection optical system and the projection optical system PL11 corresponds to the second projection optical system.

The mask M is held on a mask stage (first stage) MST. The mask stage MST is movable in a long stroke along a scanning direction (X-axis direction) and movable by a predetermined distance in a non-scanning direction (Y-axis direction). The plate P is held on a plate stage (second stage) PST. The plate stage PST is movable in a long stroke along the scanning direction (X-axis direction) and movable by a predetermined distance in the non-scanning direction (Y-axis direction). The movement of the mask stage MST and the plate stage PST is controlled by a control unit CONT. Namely, the control unit CONT controls the mask stage MST and the plate stage PST to move at a speed ratio according to the enlargement magnification of the projection optical systems PL10, PL11, PL12 and along the scanning direction and controls the mask stage MST and the plate stage PST to move at a movement distance ratio according to the enlargement magnification of the projection optical systems PL10, PL11, PL12 and along the non-scanning direction.

Figure 5:
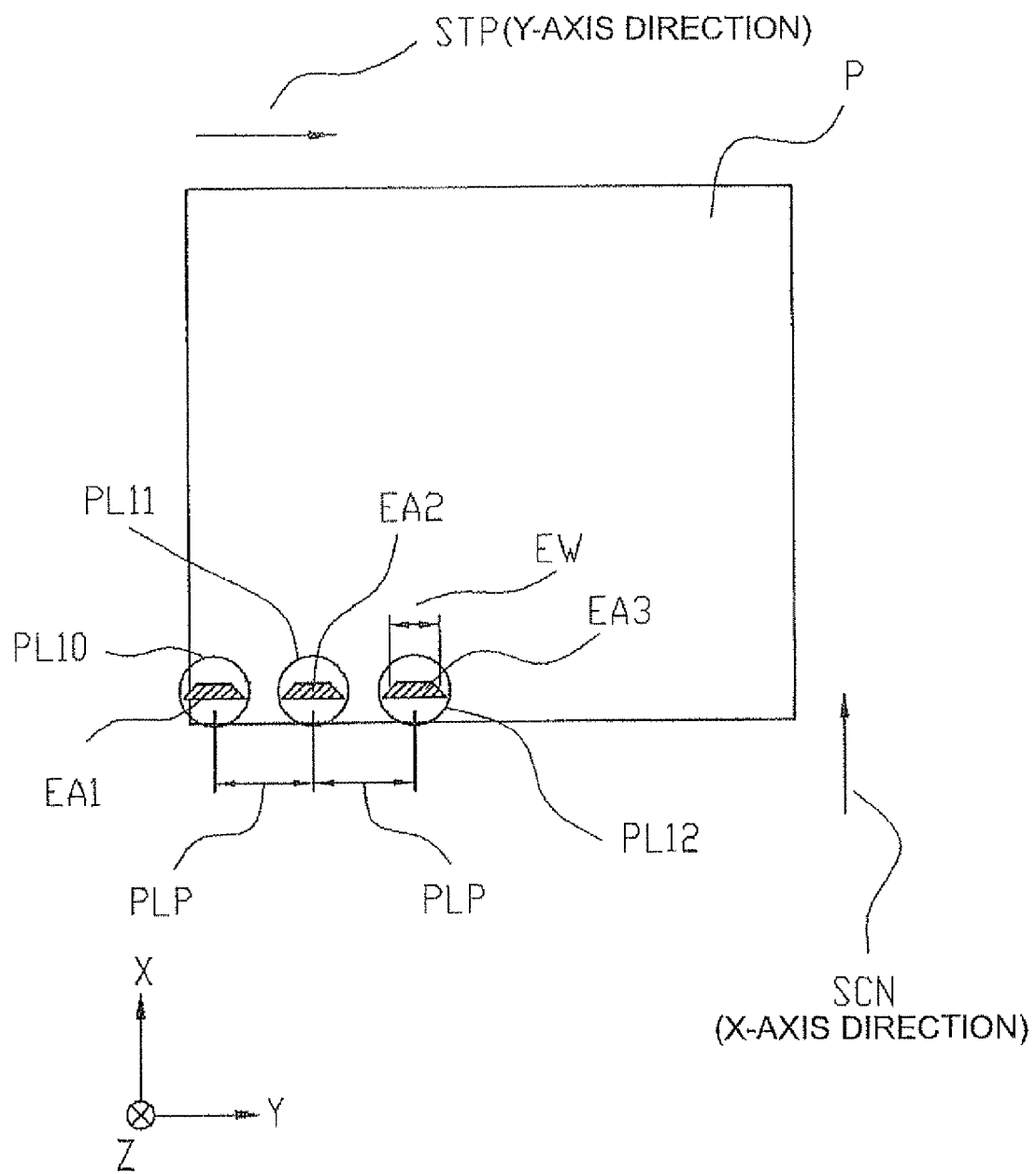
FIG. 5 is a drawing showing arrangement of projection optical systems in the exposure apparatus according to the fourth embodiment.

FIG. 5 is a drawing showing a state of arrangement of the projection optical systems PL10, PL11, PL12. The projection optical systems PL10, PL11, PL12 are discretely arranged in juxtaposition in the non-scanning direction (Y-axis direction) perpendicular to the scanning direction. The projection magnification of each projection optical system PL10, PL11, PL12 is set to 2. When the exposure regions formed by the projection optical systems PL10, PL11, PL12 are defined as EA1, EA2, and EA3, respectively, the exposure regions EA1, EA2, EA3 are separated from each other by a predetermined distance. Let EW be an effective exposure width in the Y-axis direction of each of the exposure regions EA1, EA2, EA3 by the projection optical systems PL10, PL11, PL12. The interval distance in the Y-axis direction between the projection optical system PL10 and the projection optical system PL11 is PLP and the interval distance in the Y-axis direction between the projection optical system PL11 and the projection optical system PL12 is also PLP. In this case, the relationship between the effective exposure width EW of each projection optical system PL10, PL11, PL12 and the interval distance PLP in the Y-axis direction between the projection optical systems is given by the following equation:

$$PLP=2\times EW.$$

The following relation holds:

$$EW=2\times MW,$$

where MW is an effective exposure width on the mask M corresponding to each projection optical system PL10, PL11, PL12.

Figure 6:
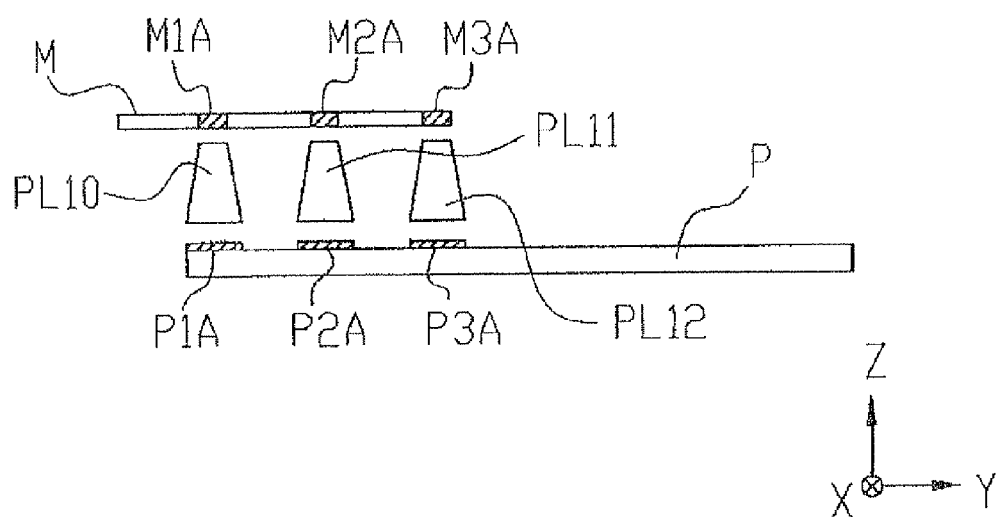
FIG. 6 is a drawing for explaining an exposure method using the exposure apparatus according to the fourth embodiment.

The below will describe an exposure method using the exposure apparatus of this embodiment, with reference to FIG. 6. First, step 1 will be described with reference to FIG. 6. As shown in this figure, the exposure regions projected onto the plate P by the projection optical systems PL10, PL11, and PL12 are denoted by NA, P2A, and P3A, respectively, and the illumination regions on the mask M by M1A, M2A, and M3A, respectively. For example, the illumination region M1A can be deemed as a portion on the mask and the illumination region M2A as a different portion on the mask. For example, the exposure region NA can be deemed as a first region on the plate and the exposure region P2A as a second region on the plate. In the present embodiment the portion (e.g., M1A) and the different portion (e.g., M2A) on the mask are integrally formed on the single mask, but they may also be separately formed on different masks. For example, it is also possible to adopt a configuration wherein the portion (MIA herein) is formed on a first mask and wherein the different portion (M2A herein) is formed on a second mask. In this case, only the portion or the different portion on the mask can be moved in the non-scanning direction by controlling the mask stage MST by the control unit CONT.

When the scanning direction is the X-axis direction, the exposure apparatus satisfies the following relation:

$$VP=2\times VM,$$

where VM is a scanning speed of the mask M and VP is a scanning speed of the plate P. Therefore, the following relation holds:

$$PXL=2\times MXL,$$

where MXL is the length of the illumination region in the X-axis direction on the mask M and PXL is the length of the exposure region in the X-axis direction on the plate P.

Figure 7:
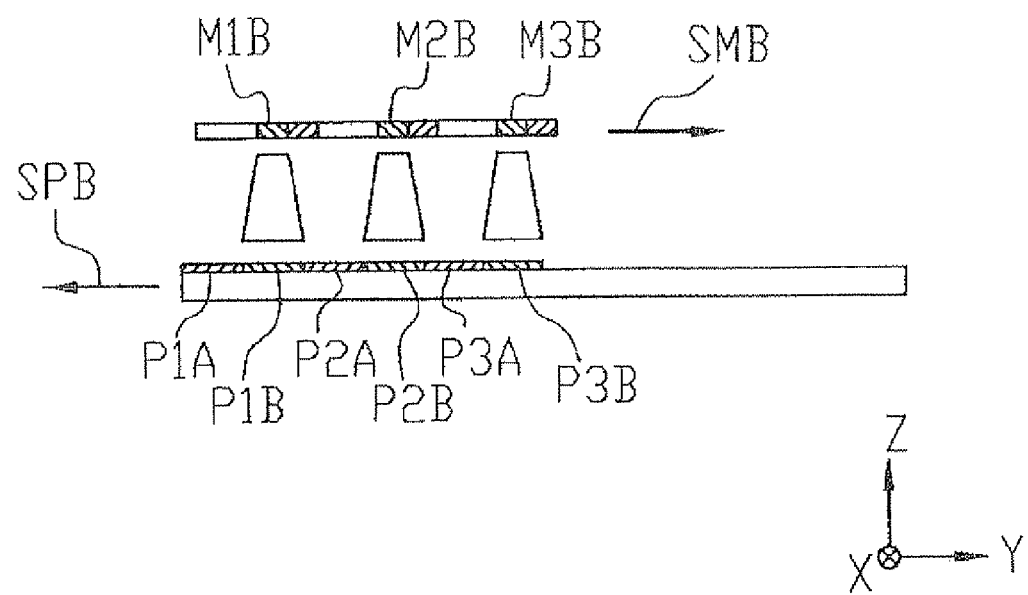
FIG. 7 is a drawing for explaining the exposure method using the exposure apparatus according to the fourth embodiment.

Next, step 2 will be described with reference to FIG. 7. As shown in this figure, after completion of the exposure by the exposure length PXL on the plate P in step 1, the plate P is moved by SPB (distance equal to EW) in the −Y-axis direction. The mask M is moved by SMB (distance equal to MW) in the Y-axis direction. Thereafter, scanning exposure is performed. Regions exposed at this time on the plate P are P1B, P2B, and P3B, among which P1B is exposed so as to overlap in part in the Y-axis direction with the adjacent exposure regions NA, P2A already exposed in previous step 1. The exposure region P2B is exposed so as to overlap in part in the Y-axis direction with the adjacent exposure regions P2A, P3A already exposed in previous step 1. The exposure region P313 is exposed so as to overlap in part in the Y-axis direction with the adjacent exposure region P3A already exposed in previous step 1.

Figure 8:
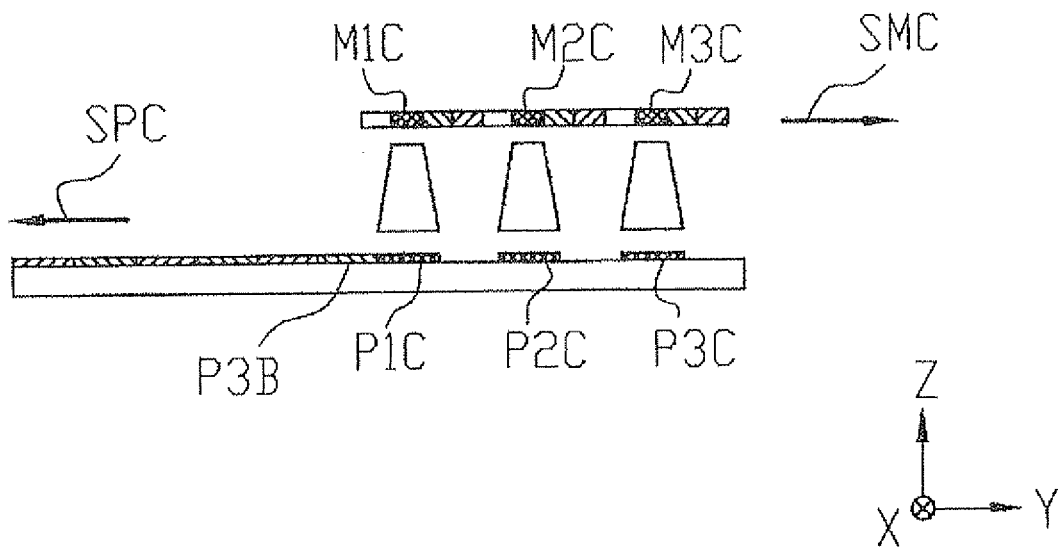
FIG. 8 is a drawing for explaining the exposure method using the exposure apparatus according to the fourth embodiment.

Next, step 3 will be described with reference to FIG. 8. After completion of the exposure by the exposure length PXL on the plate P in step 2, the plate P is moved by SPC (distance equal to 5×EW) in the −Y-axis direction. The mask M is moved by SMC (distance equal to MW) in the Y-axis direction. Thereafter, scanning exposure is performed. Regions exposed at this time on the plate P are regions P1C, P2C, and P3C, among which P1C is exposed so as to overlap in part in the Y-axis direction with the adjacent exposure region P3B already exposed in previous step 2.

Figure 9:
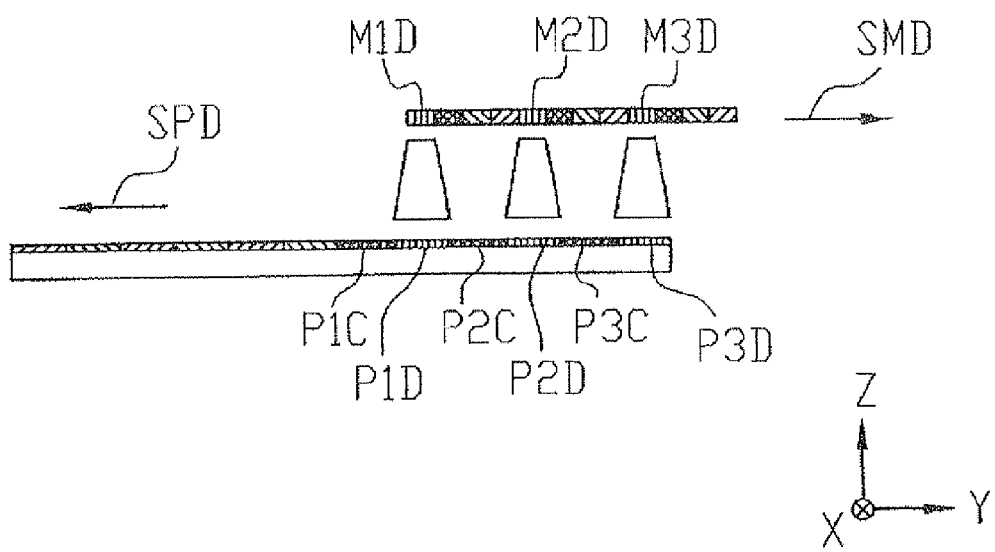
FIG. 9 is a drawing for explaining the exposure method using the exposure apparatus according to the fourth embodiment.

Next, step 4 will be described with reference to FIG. 9. After completion of the exposure by the exposure length PXL on the plate P in step 3, the plate P is moved by SPD (distance equal to EW) in the −Y-axis direction. The mask M is moved by SMD (distance equal to MW) in the Y-axis direction. Thereafter, scanning exposure is performed. Regions exposed at this time on the plate P are regions P1D, P2D, and P3D, among which P1D is exposed so as to overlap in part in the Y-axis direction with the adjacent exposure regions P1C, P2C already exposed in previous step 3. The exposure region P2D is exposed so as to overlap in part in the Y-axis direction with the adjacent exposure regions P2C, P3C already exposed in previous step 3. The exposure region P3D is exposed so as to overlap in part in the Y-axis direction with the adjacent exposure region P3C already exposed in previous step 3.

Through the above-described steps 1-4, the region area SM=12×MW ×MXL on the mask M is transferred into the region area SP=12×EW×PXL on the plate by the exposure apparatus of the present invention.

Using the aforementioned relations, the following relation holds between SM and SP:

$$SP=4\times SM.$$

Therefore, the plate can be exposed in the region having the area four times that on the mask M.

Figure 10:
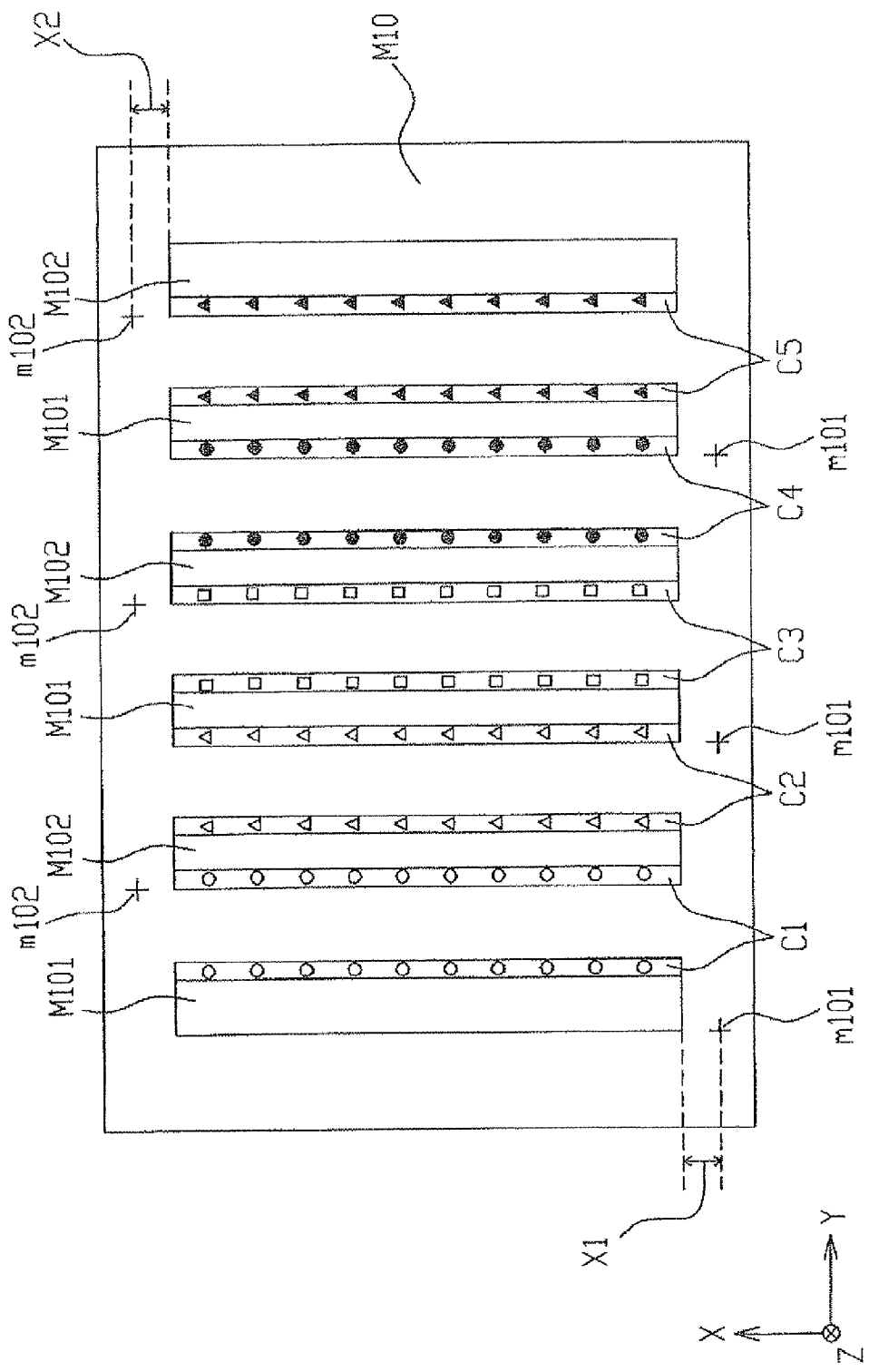
FIG. 10 is a drawing for explaining a configuration of a mask used in an exposure apparatus with projection optical systems for forming erect images according to an embodiment.

The following will describe the mask used in the exposure method according to the above-described embodiment. FIG. 10 is a drawing showing the mask, for example, in a case where the projection optical systems PL10, PL11, PL12 in the foregoing exposure apparatus are composed of optical systems for forming erect images. The mask M10, as shown in FIG. 10, has a plurality of odd-line pattern regions M101 (three pattern regions herein) and a plurality of even-line pattern regions M102 (three pattern regions herein). The plurality of odd-line pattern regions M101 herein refer, for example as shown in the same drawing, to pattern regions in the odd-numbered lines, i.e., the first, third, and fifth pattern regions from the left in the Y-axis direction (non-scanning direction), and the plurality of even-line pattern regions M102 refer similarly to pattern regions in the even-numbered lines, i.e., the second, fourth, and sixth pattern regions from the left in the Y-axis direction (non-scanning direction).

At least a pair of adjacent odd-line pattern region M101 and even-line pattern region M102 have respective common regions having a same pattern at an end in the Y-axis direction (non-scanning direction). Each of the common regions herein is formed on the side where at least a pair of adjacent odd-line pattern region M101 and even-line pattern region M102 are adjacent to each other. For example, as shown in FIG. 10, the common regions C1, C2, C3, C4, and C5 each are formed.

Figure 11:
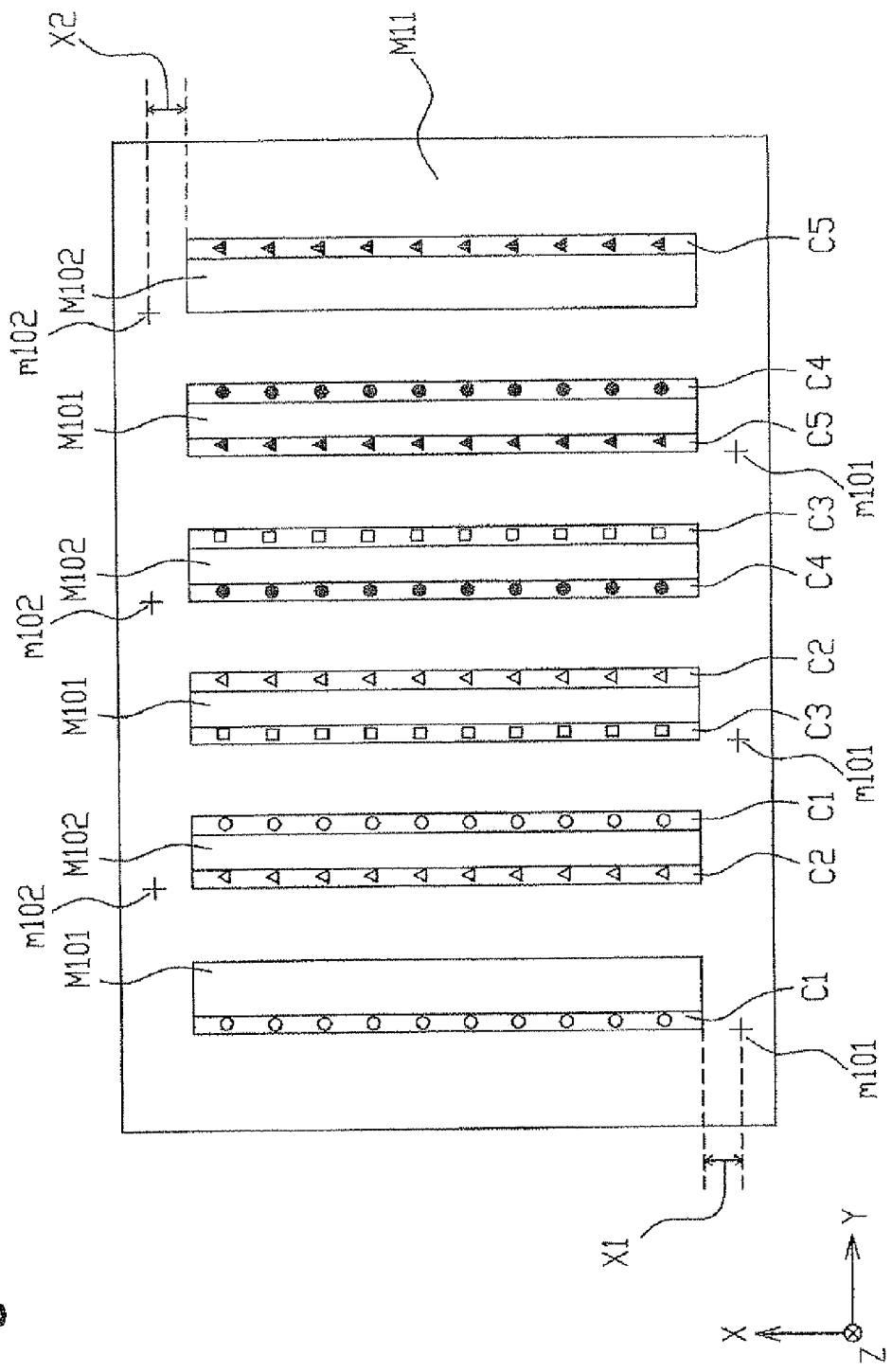
FIG. 11 is a drawing for explaining a configuration of a mask used in an exposure apparatus with projection optical systems for forming inverted images according to an embodiment.

FIG. 11 is a drawing showing the mask, for example, in a case where the projection optical systems PL10, PL11, PL12 in the aforementioned exposure apparatus are composed of optical systems for forming inverted images. As shown in FIG. 11, the mask has a plurality of odd-line pattern regions M101 (three pattern regions herein) and a plurality of even-line pattern regions M102 (three pattern regions herein). The plurality of odd-line pattern regions M101 herein refer, for example as shown in the same drawing, to pattern regions in the odd-numbered lines, i.e., the first, third, and fifth pattern regions from the left in the Y-axis direction (non-scanning direction), and the plurality of even-line pattern regions M102 refer similarly to pattern regions in the even-numbered lines, i.e., the second, fourth, and sixth pattern regions from the left in the Y-axis direction (non-scanning direction).

At least a pair of adjacent odd-line pattern region M101 and even-line pattern region M102 have respective common regions having a same pattern at an end in the Y-axis direction (non-scanning direction). Each of the common regions herein is formed on the side opposite to the side where at least a pair of adjacent odd-line pattern region M101 and even-line pattern region M102 are adjacent to each other. For example, as shown in FIG. 11, the common regions C1, C2, C3, C4, and C5 each are formed.

Figure 12:
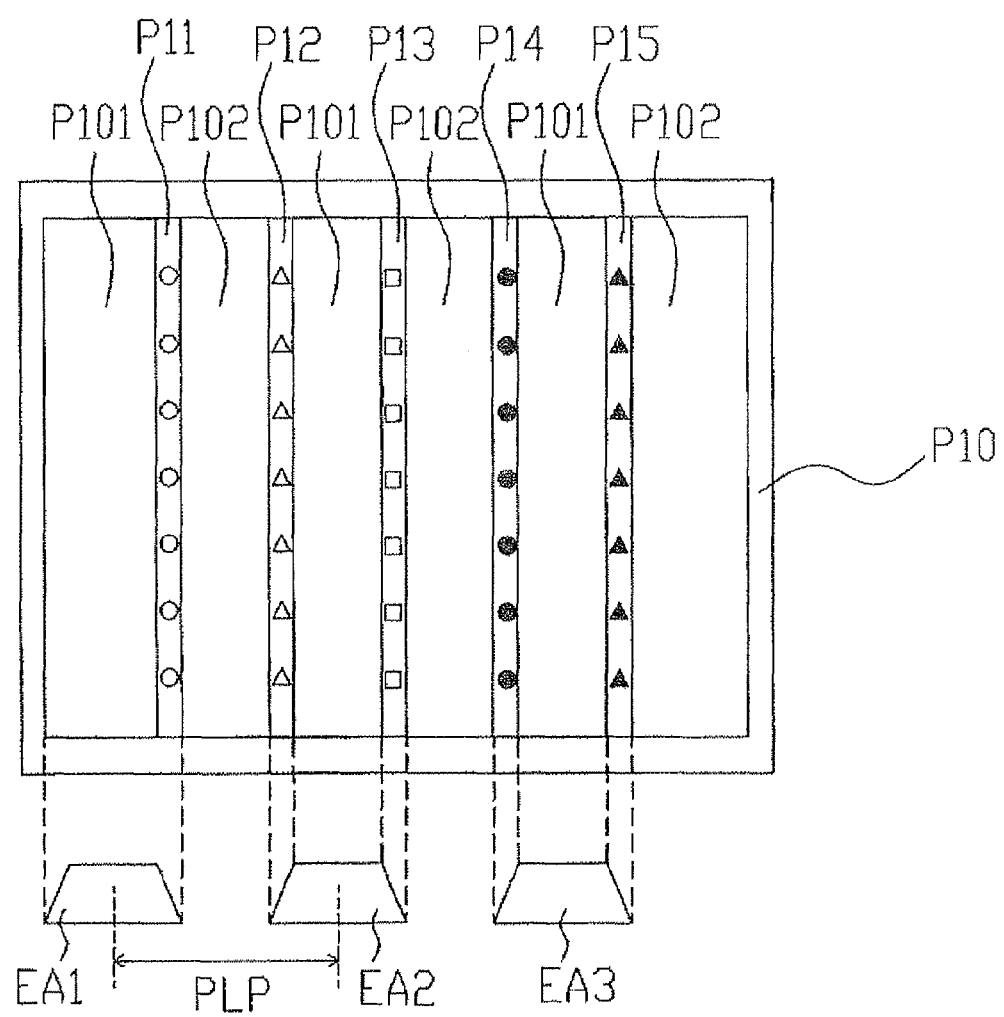
FIG. 12 is a drawing showing a state in which patterns of the mask according to the embodiment are transferred onto a plate.

In the mask M10 shown in FIG. 10 and the mask M11 shown in FIG. 11, the common regions C1-C5 are transferred as superimposed in whole or in part so that the common regions of at least a pair of adjacent odd-line pattern region M101 and even-line pattern region M102 overlap to form one objective pattern. FIG. 12 is a drawing showing a state in which the mask M10 (M11) is transferred onto the plate. As shown in FIG. 12, the following regions are formed on the plate P10: regions P101 where the odd-line pattern regions M101 are transferred; regions P102 where the even-line pattern regions M102 are transferred; regions P11, P12, P13, P14, and P15 where the common regions C1-C5 are transferred. In the drawing EA1, EA2, and EA3 represent the exposure regions by the projection optical systems PL1, PL2, and PL3, respectively, and PLP indicates an interval between centers of adjacent exposure regions.

The pair of common regions C1-C5 can be patterns that form one pattern when overlapping with each other, and the patterns formed in the pair of common regions C1-C5 do not have to be perfectly identical. For example, of common regions of a pair of adjacent odd-line pattern region M101 and even-line pattern region M102, either the common region of the odd-line pattern region M101 or the common region of the even-line pattern region M102 may include an unnecessary pattern that is not used at all.

As shown in FIGS. 10 and 11, the mask M10 (M11) has a plurality of first reference marks m101 formed in a predetermined positional relation with the odd-line pattern regions M101, and a plurality of second reference marks m102 formed in a predetermined positional relation with the even-line pattern regions M102. The first reference marks m101 and the second reference marks m102 herein are, for example, alignment marks for registration of the mask M10 (M11) with the apparatus (e.g., the mask stage MST), arrangement adjustment marks for adjustment of arrangement of the projection optical systems PL10, PL11, PL12, focus position detection marks for detection of deformation in the Z-axis direction of the pattern surface of the mask, alignment marks for detection of relative positional deviation (joint error) of images of the odd-line pattern regions M101 or the even-line pattern regions M102 formed by the respective projection optical systems PL10, PL11, PL12, or the like. The first reference marks may be formed in a predetermined positional relation with the even-line pattern regions M102 on the mask M10 (M11) and the second reference marks may be formed in a predetermined positional relation with the odd-line pattern regions M101 on the mask M10 (M11).

The first reference marks m101 are located at positions separate by a predetermined distance from the odd-line pattern regions M101 (e.g., in FIG. 10 or FIG. 11, the first reference mark m101 is separated by distance X1 in the X-axis direction from the first odd-line pattern region M101 from the left). Likewise, the second reference marks m102 are located at positions separate by a predetermined distance from the even-line pattern regions M102 (e.g., in FIG. 10 or FIG. 11, the second reference mark m102 is separated by distance X2 in the X-axis direction from the sixth even-line pattern region M102 from the left). The first reference marks m101 and the second reference marks m102 may also be located between the odd-line pattern regions M101 and the even-line pattern regions M102, in the odd-line pattern regions M101 or the even-line pattern regions M102, or in any other regions on the mask.

Figure 13:
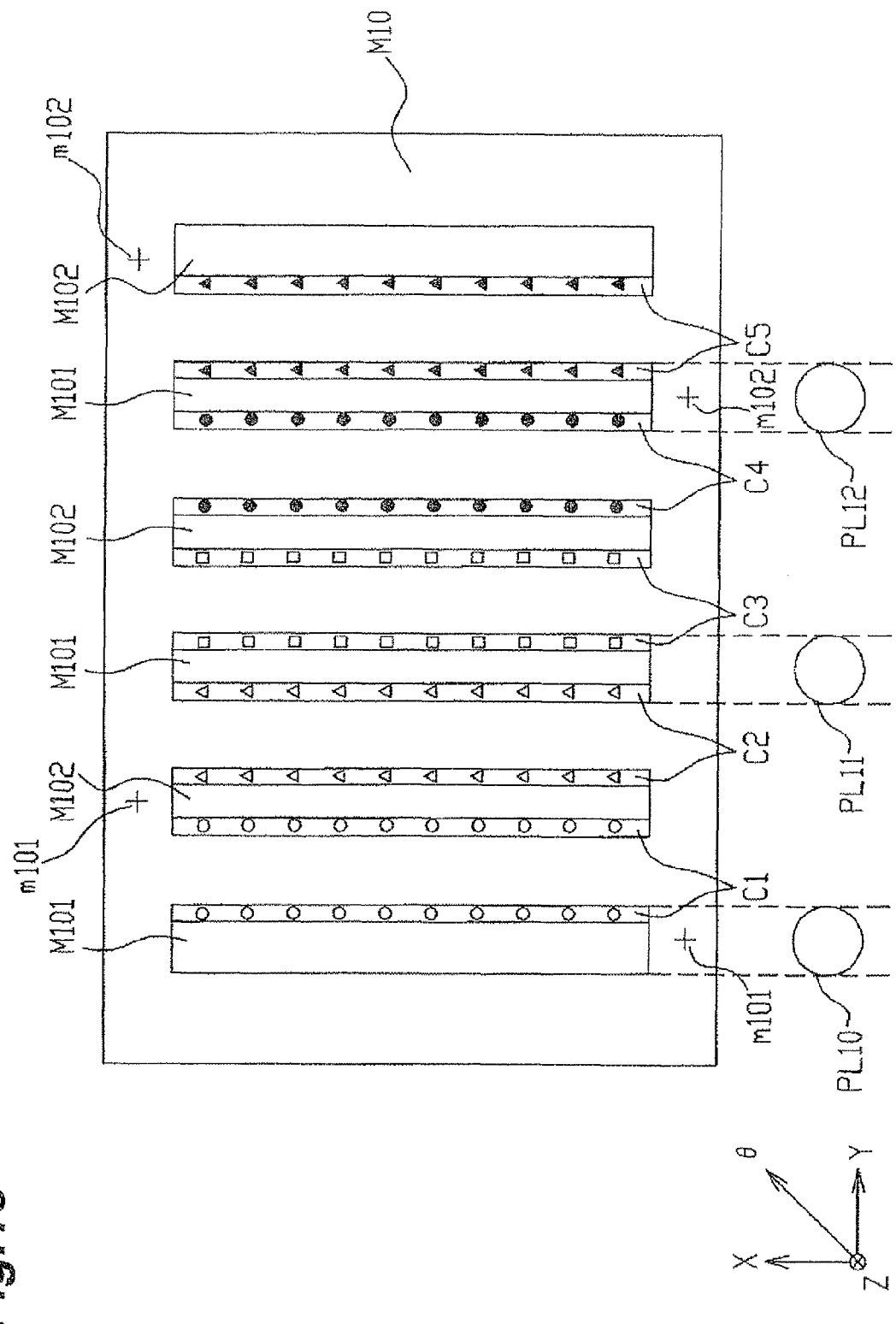
FIG. 13 is a drawing for explaining a configuration of a mask used in an exposure apparatus with projection optical systems for forming erect images according to an embodiment.
Figure 14:
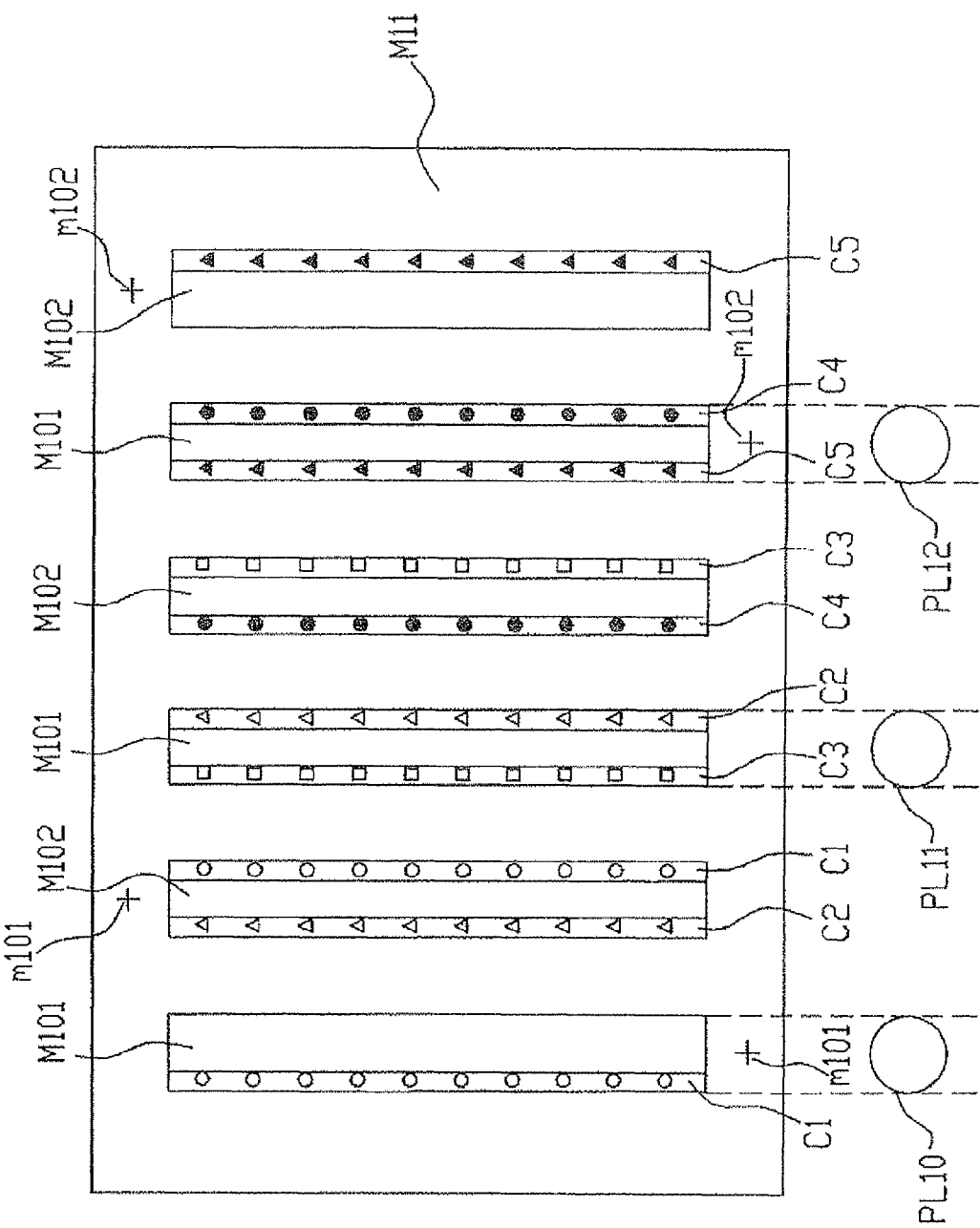
FIG. 14 is a drawing for explaining a configuration of a mask used in an exposure apparatus with projection optical systems for forming inverted images according to an embodiment.

Furthermore, FIG. 13 shows another mask M10 in the case where the projection optical systems PL10, PL11, PL12 are composed of optical systems for forming erect images. FIG. 14 shows another mask M11 in the case where the projection optical systems PL10, PL11, PL12 are composed of optical systems for foliating inverted images. As shown in FIGS. 13 and 14, at least one first reference mark m101 is located in a coordinate range in the Y-axis direction of an odd-line pattern region M101 (e.g., the first odd-line pattern region M101 from the left). Similarly, at least one second reference mark m102 is located in a coordinate range in the Y-axis direction of another odd-line pattern region M101 (e.g., the fifth odd-line pattern region M101 from the left) different from the odd-line pattern region M101 for which the first reference mark m101 is located. For example, in a case where alignment is carried out before scanning of the mask, the mask can be scanned without moving the mask in the Y-axis direction after the alignment. The first reference mark or the second reference mark may also be located in a coordinate range in the Y-axis direction of an even-line pattern region M102.

For example, in a case where the first reference marks are alignment marks for registration of the mask in the X- and Y-directions and where the second reference marks are alignment marks for registration of the mask in the θ-direction, it is desirable to locate the first reference marks and the second reference marks as apart as possible in the Y-axis direction. Specifically, as shown in FIGS. 13 and 14, a desired configuration is such that the first reference mark is located in the coordinate range in the Y-axis direction of the first odd-line pattern region M101 from the left and the second reference mark is located in the coordinate range in the Y-axis direction of the fifth odd-line pattern region M101 from the left. The θ-direction herein refers to a deviation direction (inclination direction) of the mask relative to the X- and Y-directions.

Figure 15:
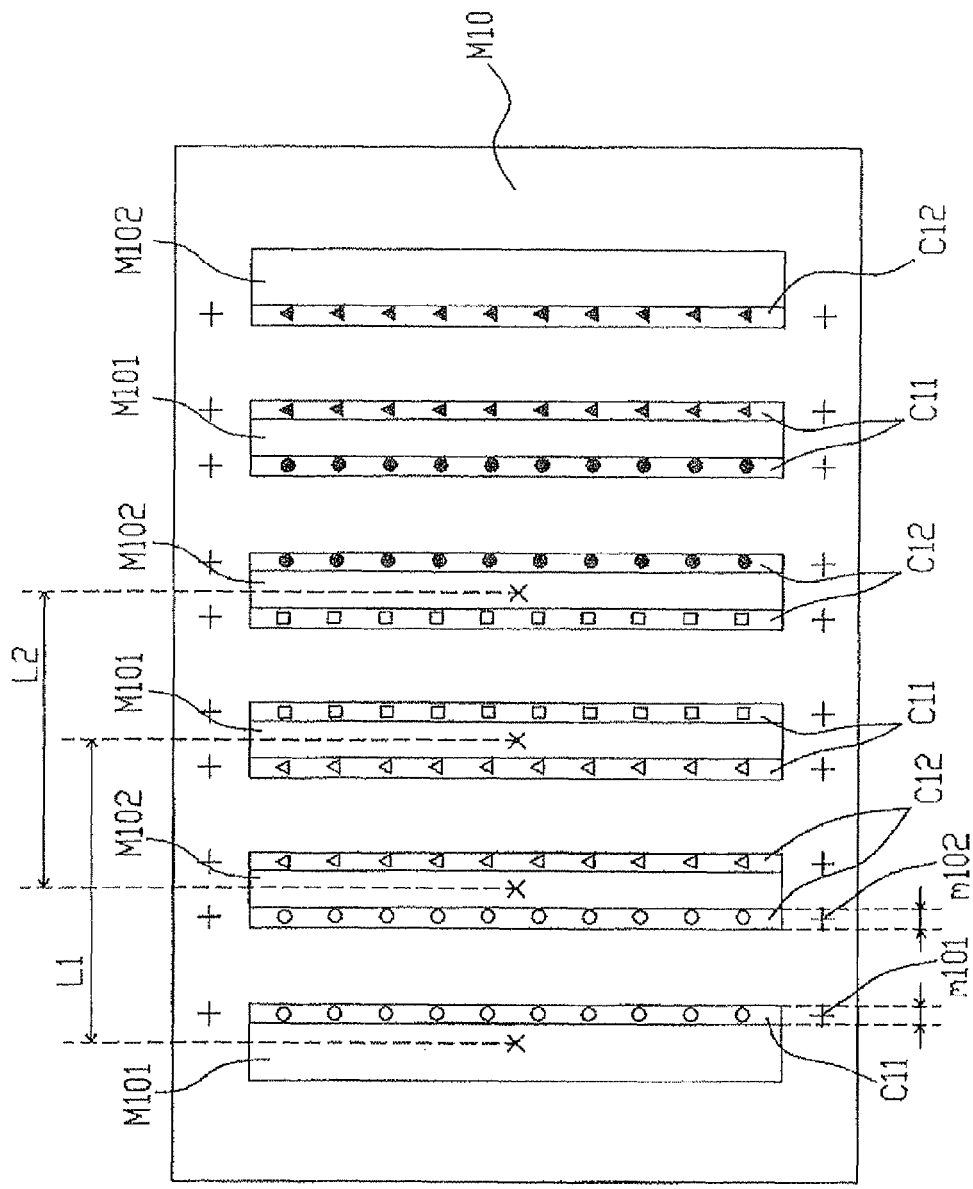
FIG. 15 is a drawing for explaining a configuration of a mask used in an exposure apparatus with projection optical systems for forming erect images according to an embodiment.
Figure 16:
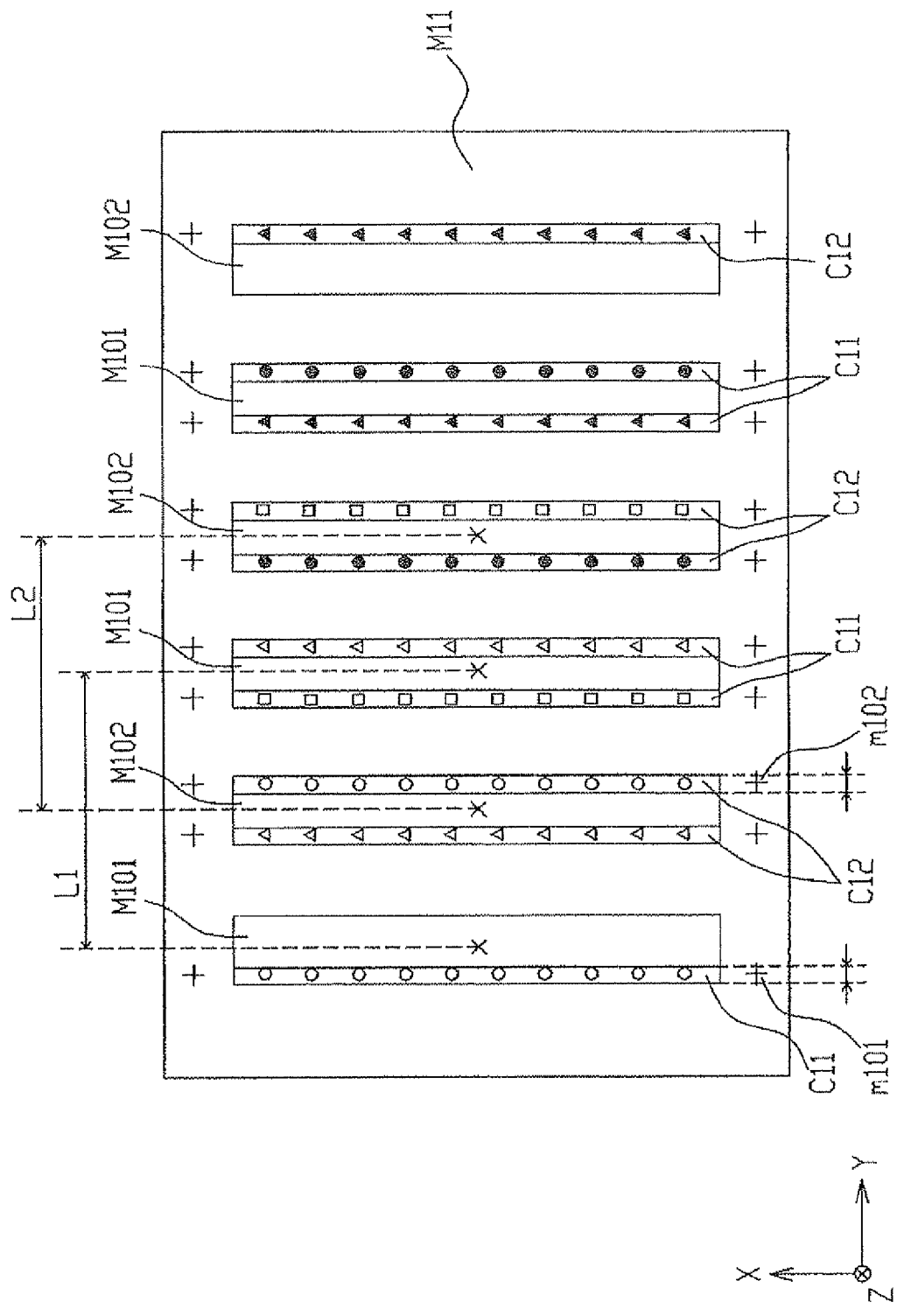
FIG. 16 is a drawing for explaining a configuration of a mask used in an exposure apparatus with projection optical systems for forming inverted images according to an embodiment.

FIG. 15 shows another mask M10 in the case where the projection optical systems PL10, PL11, PL12 are composed of optical systems for forming erect images, and FIG. 16 shows another mask M11 in the case where the projection optical systems PL10, PL11, PL12 are composed of optical systems for forming inverted images. As shown in FIGS. 15 and 16, the first reference marks m101 are desirably located in respective coordinate ranges in the Y-axis direction of the common regions C11 of the odd-line pattern regions M101. Similarly, the second reference marks m102 are desirably located in respective coordinate ranges in the Y-axis direction of the common regions C12 of the even-line pattern regions M102. In this arrangement, for example, the first reference marks m101 or the second reference marks m102 function as alignment marks for registration of the mask with the apparatus or arrangement adjustment marks for adjustment of arrangement of the projection optical systems, and also function as alignment marks for detection of relative positional deviation (joint error) of images of the odd-line pattern regions M101 or the even-line pattern regions M102 formed by the respective projection optical systems PL10, PL11, PL12. Namely, in the case of joined exposure, it is feasible to determine a level of joint error, by measuring the relative positional deviation between the first reference marks m101 and the second reference marks m102.

Figure 17:
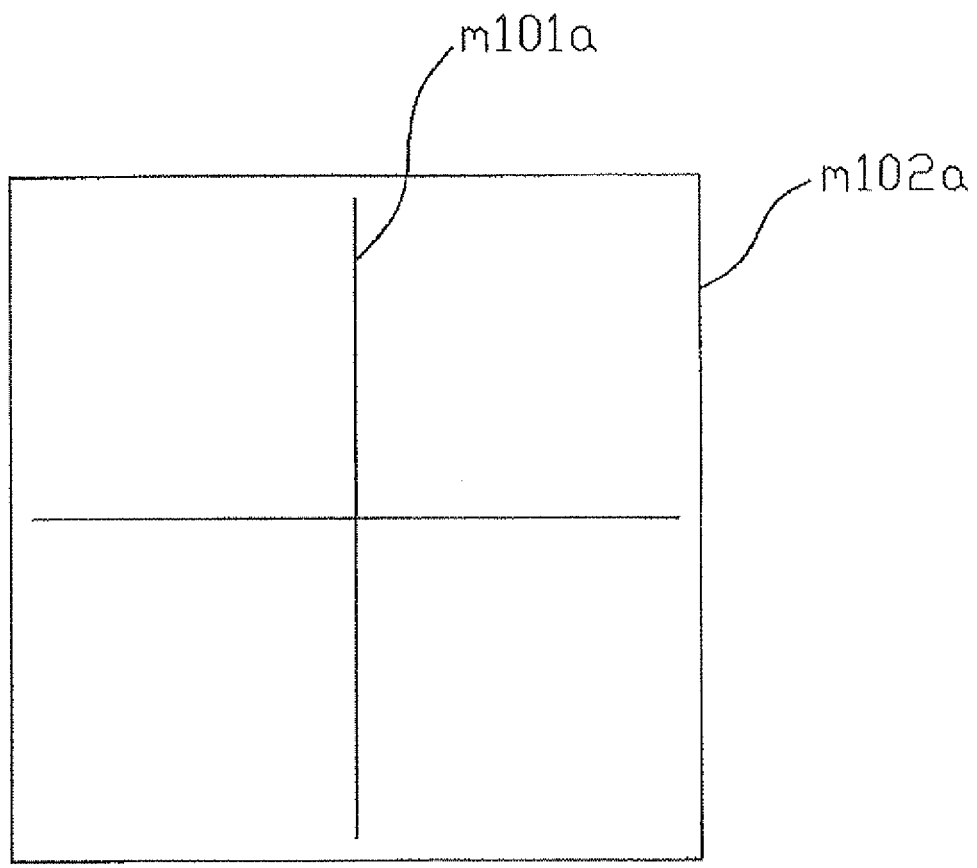
FIG. 17 is a drawing showing shapes of reference marks according to an embodiment.

FIG. 17 shows an example of first reference mark m101a and second reference mark m102a formed on the plate in the present embodiment. For example, the first reference mark m101 formed on the mask M is cross-shaped and the second reference mark is square. When the cross-shaped first reference mark m101 and the square second reference mark m102 are printed as superimposed on each other on the plate P, the mark as shown in FIG. 17 is formed on the plate P. A relative positional deviation between the first reference mark m101a and the second reference mark m102a formed on the plate P is measured, for example, with a plate appearance tester and the level of joint error is determined based thereon. If the joint error exceeds a tolerance, an etching step is not carried out, but the resist is removed and the pattern of the mask M is again printed on the plate. This can reduce unnecessary etching steps. The plate appearance tester herein is a device for detecting deviation of the pattern on the plate, the joint error, or the like with an optical microscope.

In FIGS. 15 and 16, of at least a pair of odd-line pattern regions M101, an arrangement interval in the Y-axis direction (non-scanning direction) between one odd-line pattern region M101 and the other odd-line pattern region M101 is defined as a first arrangement interval L1. Furthermore, of at least a pair of even-line pattern regions M102, an arrangement interval in the Y-axis direction (non-scanning direction) between one even-line pattern region M102 and the other even-line pattern region M102 is defined as a second arrangement interval L2. The first arrangement interval L1 is approximately equal to the second arrangement interval L2. For example, in FIG. 15 or FIG. 16, the arrangement interval L1 in the Y-axis direction between the first and third odd-line pattern regions M101 in the odd-numbered lines from the left is arranged as approximately equal to the arrangement interval L2 in the Y-axis direction between the second and fourth even-line pattern regions M102 in the even-numbered lines similarly from the left. For example, in FIG. 15 or FIG. 16, the first arrangement interval L1 herein is a distance in the Y-axis direction between the position of the center of the first odd-line pattern region M101 from the left and the position of the center of the third odd-line pattern region M101 from the left. Similarly, for example, in FIG. 15 or FIG. 16, the second arrangement interval L2 is a distance in the Y-axis direction between the position of the center of the second even-line pattern region M102 from the left and the position of the center of the fourth even-line pattern region M102 from the left.

For example, in a case where the pattern regions (odd-line pattern regions M101 or even-line pattern regions M102) on the mask in the present embodiment are original patterns for pattern exposure on a substrate through the plurality of projection optical systems PL10, PL11, PL12 with the enlargement magnification as shown in FIG. 4, the first arrangement interval L1 or the second arrangement interval L2 is desirably approximately equal to the interval in the Y-axis direction between the field regions by the plurality of projection optical systems PL10, PL11, PL12.

In the description of the mask in the present embodiment described above, the term adjacent means that the odd-line pattern region M101 and the even-line pattern region M102 do not have to be in contact but may be separated by a predetermined distance. In the case of two odd-line pattern regions and two even-line pattern regions, the term adjacent means similarly that the two odd-line pattern regions or the two even-line pattern regions do not have to be in contact but may be separated by a predetermined distance.

The following will describe the length in the Y-axis direction of the pattern regions on the mask in the present embodiment. For example, where the exposure apparatus used is constructed to obtain a uniform exposure distribution over the entire surface of the exposure region on the plate, the mask M described in the present embodiment (FIG. 10, FIG. 11, FIG. 13 to FIG. 16) may be configured so that the pattern region length in the Y-axis direction of the pattern regions formed at the both ends in the Y-axis direction (e.g., in FIG. 10, the first odd-line pattern region M101 from the left and the sixth even-line pattern region M102 from the left) is shorter than the length in the Y-axis direction of the other pattern regions. For example, in FIG. 10, the end on the opposite side to the common region C1 of the first odd-line pattern region M101 from the left is desirably shortened by the length of the common region C1. Similarly, in FIG. 10, the end on the opposite side to the common region C5 of the sixth even-line pattern region M102 from the left is desirably shortened by the length of the common region C5.

In the mask of the present embodiment, a shield zone may be formed, for example, of a shield sheet or the like around or in part of the odd-line pattern regions and even-line pattern regions and the common regions, in order to prevent exposure of an unwanted pattern formed in the marginal region or in part on the mask, misexposure with light leaking from the plate, and so on.

Figure 18:
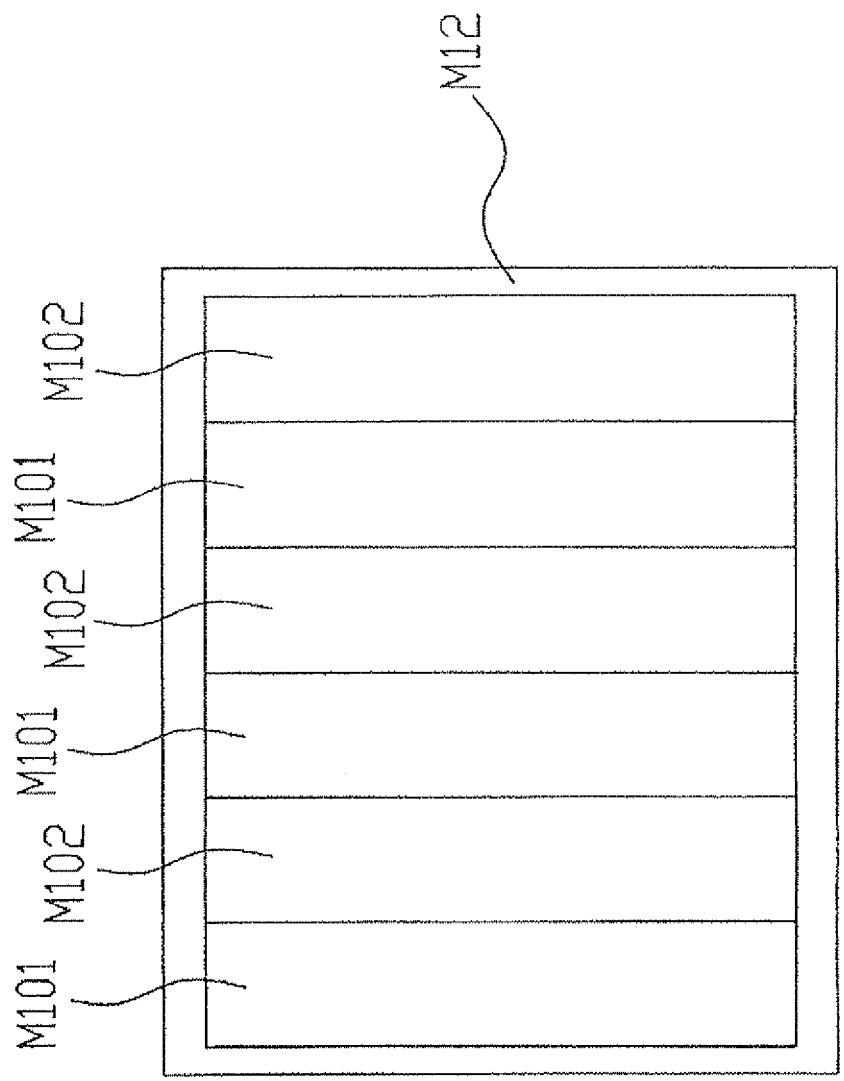
FIG. 18 is a drawing for explaining a mask manufacturing method according to an embodiment.

Methods of manufacturing the above-described masks will be described below. First described is a method of manufacturing the mask used in the exposure apparatus with the projection optical systems for forming erect images. As shown in FIG. 18, first, the entire pattern data corresponding to all the patterns to be formed on the mask is divided in the Y-direction being the non-scanning direction. Namely, for example, the entire pattern data corresponding to all the patterns is divided into six pattern data consisting of three odd-line pattern regions M101 and three even-line pattern regions M102.

Figure 19:
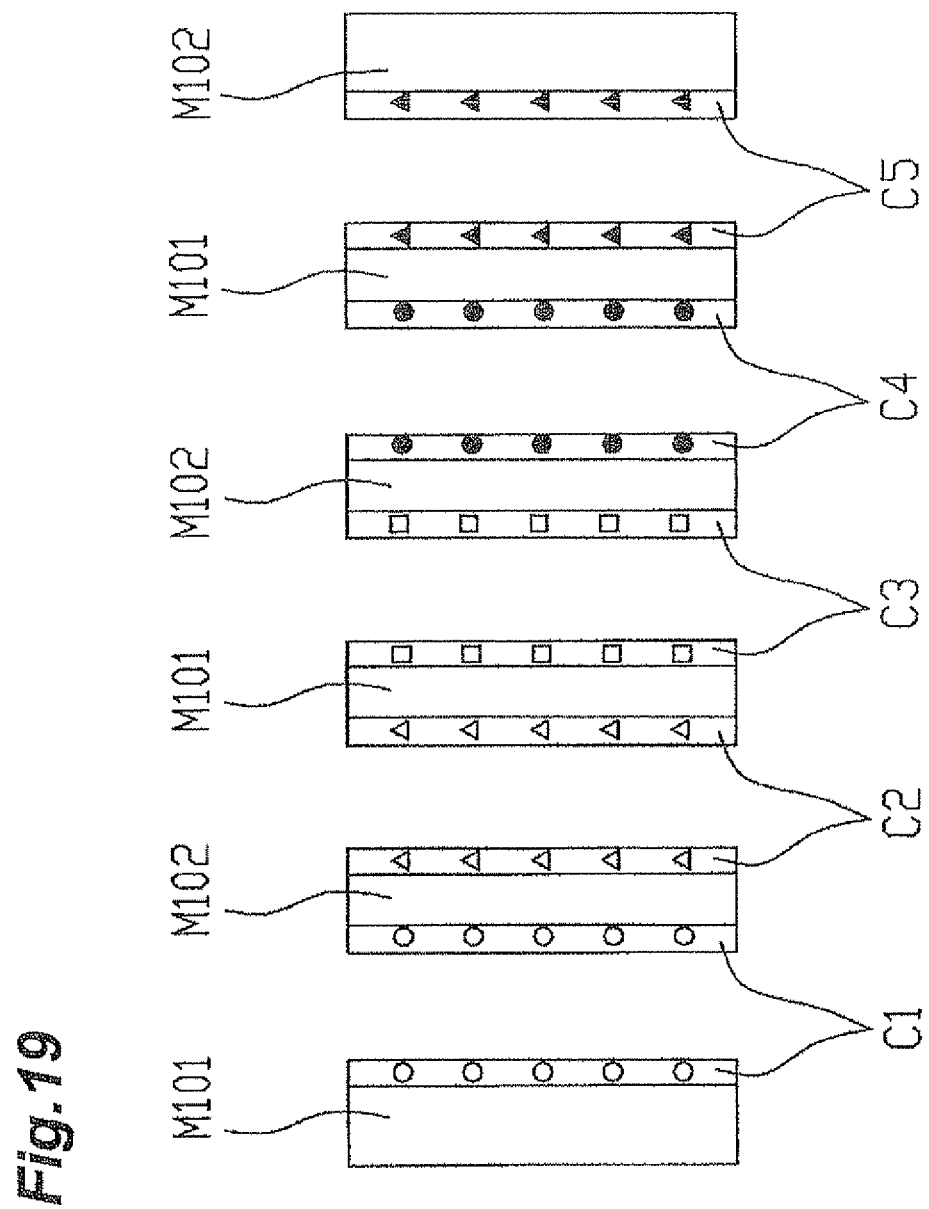
FIG. 19 is a drawing for explaining a mask manufacturing method according to an embodiment.

Next, as shown in FIG. 19, pattern data C1-C5 corresponding to the common regions are added to the ends in the Y-axis direction of the divided pattern data to create drawing data corresponding to the odd-line pattern regions M101 and the even-line pattern regions M102. In this case the common regions are formed each on the side where two adjacent odd-line pattern region M101 and even-line pattern region M102 are adjacent to each other.

Next, patterns of the plurality of odd-line pattern regions M101 and the plurality of even-line pattern regions M102, and the reference marks m101-m104 are drawn at predetermined positions on a mask substrate (blank) with an EB exposure apparatus or the like in accordance with the created drawing data. The mask M10 (e.g., FIG. 10) used in the exposure apparatus with the projection optical systems for forming erect images is manufactured in this manner.

Figure 20:
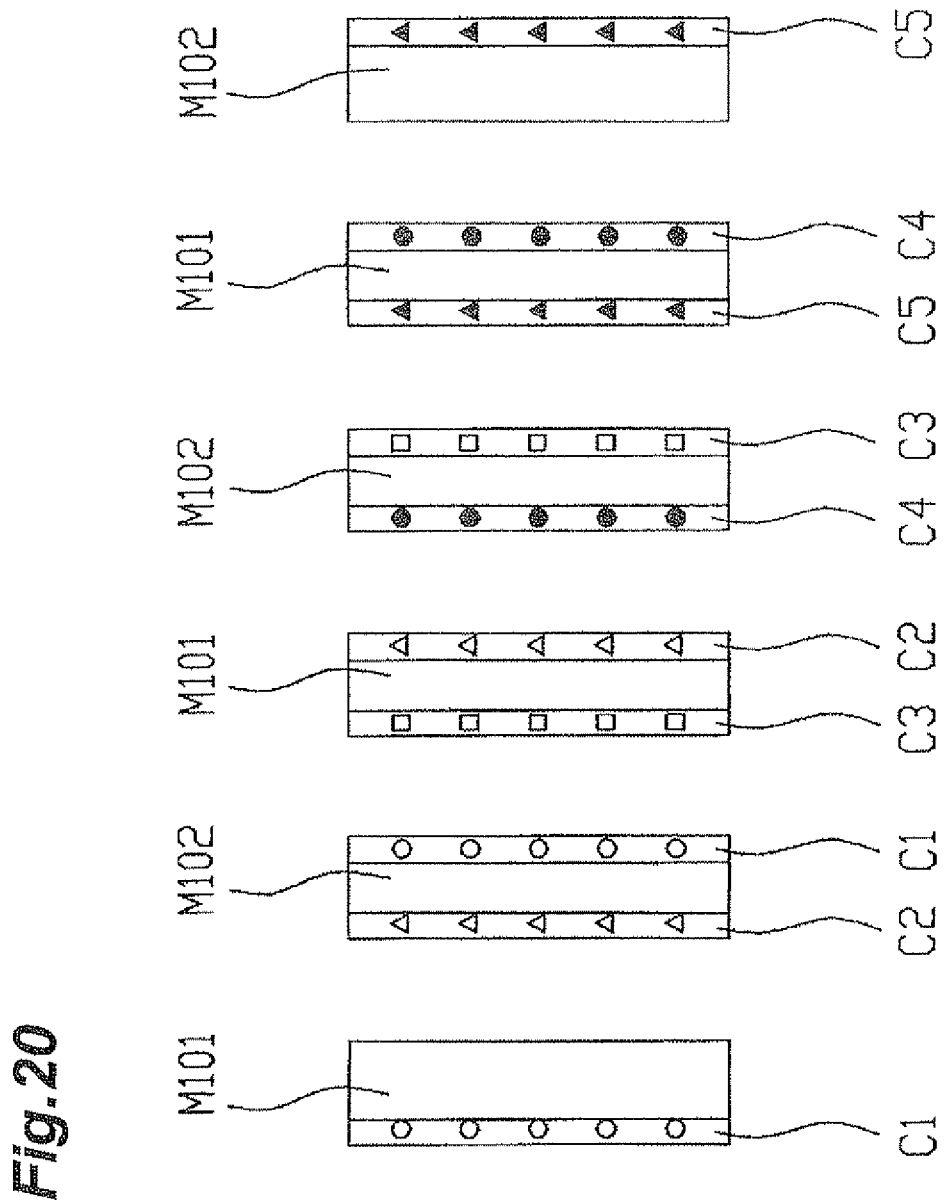
FIG. 20 is a drawing for explaining a mask manufacturing method according to an embodiment.

The following will describe a method of manufacturing a mask used in a scanning exposure apparatus with projection optical systems for forming inverted images. As shown in FIG. 18, first, the entire pattern data corresponding to all the patterns to be formed on the mask is divided in the Y-direction being the non-scanning direction. Namely, for example, the entire pattern data corresponding to all the patterns is divided into six pattern data consisting of three odd-line pattern regions M101 and three even-line pattern regions M102. Next, the pattern data of the odd-line pattern regions M101 and the even-line pattern regions M102 are inverted in the Y-axis direction and, as shown in FIG. 20, pattern data C1-C5 corresponding to the common regions are added to the ends in the Y-axis direction of the divided pattern data to create drawing data corresponding to the odd-line pattern regions M101 and the even-line pattern regions M102. In this case, the common regions are formed each on the opposite side to the side where two adjacent odd-line pattern region M101 and even-line pattern region M102 are adjacent to each other.

Next, the plurality of odd-line pattern regions M101 and the plurality of even-line pattern regions M102, and the reference marks m101-m104 are drawn at predetermined positions on a mask substrate (blank) with an EB exposure apparatus or the like in accordance with the created drawing data. The mask M11 (e.g., FIG. 11) used in the exposure apparatus with the projection optical systems for forming inverted images is manufactured in this manner.

The above-described mask manufacturing methods were arranged to divide the entire pattern data corresponding to all the patterns and then add the pattern data corresponding to the common regions thereto, but it is also possible to adopt a method of dividing the entire pattern data including the pattern data corresponding to the common regions and then drawing the patterns on a mask substrate (blank) with an ES exposure apparatus or the like in accordance with the divided pattern data.

Microdevices (semiconductor devices, imaging devices, liquid-crystal display devices, thin-film magnetic heads, etc.) can be manufactured using the exposure method of the above-described embodiment. The following will describe an example of a method for manufacturing a liquid-crystal display device (flat panel display) as a microdevice by forming predetermined circuit patterns in plates or the like as photosensitive substrates by the exposure method of the above-described embodiment, with reference to the flowchart of FIG. 21.

Figure 21:
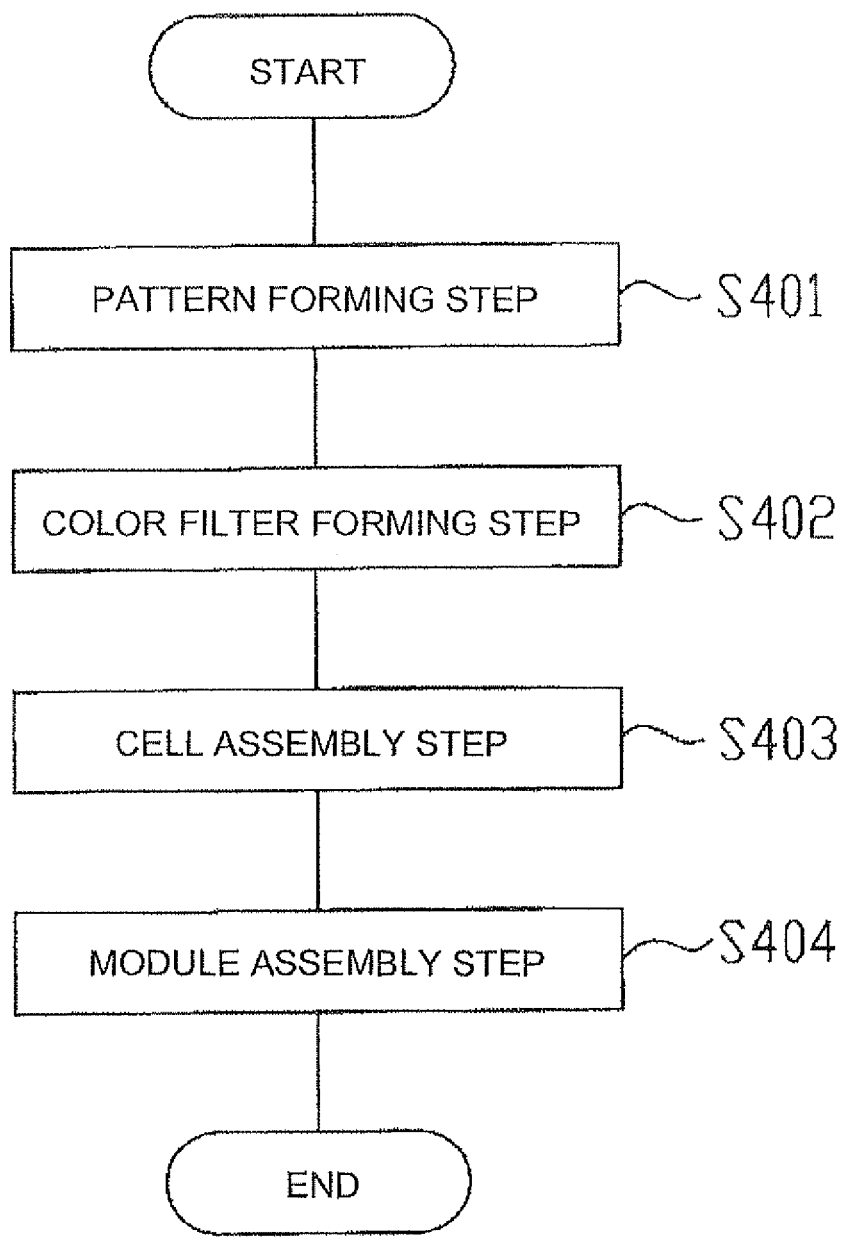
FIG. 21 is a flowchart showing a method of manufacturing a liquid-crystal display device as a microdevice according to an embodiment of the present invention.

In FIG. 21, a pattern forming step S401 is to execute a so-called photolithography step to transfer a pattern of a mask onto a photosensitive substrate (a glass substrate coated with a resist, or the like) by means of the exposure apparatus according to the embodiment. This photolithography step results in forming the predetermined pattern including a number of electrodes and others on the photosensitive substrate. Thereafter, the exposed substrate is processed through steps including a development step, an etching step, a resist removal step, etc. to form the predetermined pattern on the substrate, followed by a next color filter forming step S402.

The next color filter forming step S402 is to form a color filter in a structure in which a large number of sets of three dots corresponding to R (Red), G (Green), and B (Blue) are arrayed in a matrix pattern or in a structure in which a plurality of filter sets of three stripes of R, G, and B are arrayed in the horizontal scanning line direction. After the color filter forming step S402, a cell assembly step S403 is executed. The cell assembly step S403 is to assemble a liquid crystal panel (liquid crystal cell) using the substrate with the predetermined pattern obtained in the pattern forming step S401, the color filter obtained in the color filter forming step S402, and others. In the cell assembly step S403, for example, a liquid crystal is poured into between the substrate with the predetermined pattern obtained in the pattern forming step S401 and the color filter obtained in the color filter forming step S402, to manufacture the liquid crystal panel (liquid crystal cell).

A module assembly step S404 subsequent thereto is to attach to the panel, various components such as electric circuits, backlights, etc. for display operation of the liquid crystal panel (liquid crystal cell) thus assembled, thereby completing a liquid-crystal display device. Since the above-described manufacturing method of the liquid-crystal display device is arranged to perform the exposure with the use of the wide exposure region, the liquid-crystal display device as a flat panel display can be obtained at high throughput.

The projection optical system of the present invention is provided as a projection optical system having an enlargement magnification and well corrected for aberration.

The exposure apparatus of the present invention is able to perform good exposure with a large exposure region, without increase in the mask size.

The exposure method of the present invention permits execution of good exposure over a wide exposure region, without increase in mask size.

Since the display manufacturing method of the present invention is arranged to perform the exposure using the exposure apparatus of the present invention or the exposure method of the present invention, it is feasible to manufacture a good display.

Since the mask of the present invention can be applied to transfer of the pattern of the mask onto a large-size plate without increase in the size of the mask, it is feasible to reduce the manufacturing cost of the mask.

Since the mask manufacturing method of the present invention can be used in the exposure apparatus with the projection optical systems having an enlargement magnification, it can reduce the manufacturing cost of the mask.

It should be noted that the embodiments described above were described for easier understanding of the present invention but not described to restrict the present invention. Therefore, each of the elements disclosed in the embodiments is intended to embrace all design changes and equivalents belonging to the technical scope of the present invention.

The disclosure in the present specification is associated with the subject matter included in Japanese Patent Application No. 2006-39446 filed on Feb. 16, 2006 and Japanese Patent Application No. 2007-14631 filed on Jan. 25, 2007, and the disclosure of the Japanese patent applications are explicitly incorporated herein by reference in its entirety.

EXAMPLES

Example 1 to Example 3 will be described below, and it is noted that the reference symbols used in the description of the catadioptric systems according to the first to third embodiments will be used in the description of catadioptric systems in Example 1 to Example 3 because the configurations of the catadioptric systems in Example 1 to Example 3 are the same as those of the catadioptric systems in the first to third embodiments shown in FIGS. 1 to 3, respectively. The specifications of optical members in the catadioptric systems PL1-PL3 in Example 1 to Example 3 are presented in Tables 1 to 3. In the specifications of the optical members in Table 1 to Table 3, each surface number in the first column represents an order of a surface along a ray traveling direction from the object side, the second column a radius of curvature of each surface (mm), each surface separation in the third column a surface interval (mm) on the optical axis, the fourth column the refractive index of a glass material of each optical member for the g-line, the fifth column the refractive index of a glass material of each optical member for the h-line, the sixth column the refractive index of a glass material of each member for the i-line, and the seventh column the reference symbol of each lens.

Example 1

The below presents values of the specifications of the catadioptric system PL1 in Example 1.

(Specifications)

Numerical aperture (NA) on the object side (glass substrate side): 0.065

Projection magnification: 1.5

Values corresponding to the condition:

Focal length FPG1 of the first lens unit=906.5 mm

Focal length FPG3 of the third lens unit=1429.8 mm $$|FPG3/FPG1| = 1429.8/906.5$$
$$= 1.6$$

TABLE 1

(Specifications of optical members)

| | r | d | n(g) | n(h) | n(i) | |
|---|---|---|---|---|---|---|
| 0 | | 97.032 | 1.00000 | 1.00000 | 1.00000 | |
| 1 | −254.374 | 27.209 | 1.48032 | 1.48272 | 1.48677 | L101 |
| 2 | −172.584 | 13.935 | 1.00000 | 1.00000 | 1.00000 | |
| 3 | −166.928 | 20.000 | 1.46671 | 1.46964 | 1.47456 | L111 |
| 4 | 449.499 | 10.438 | 1.00000 | 1.00000 | 1.00000 | |
| 5 | 511.800 | 35.000 | 1.48032 | 1.48272 | 1.48677 | L121 |
| 6 | −352.458 | 10.649 | 1.00000 | 1.00000 | 1.00000 | |
| 7 | ∞ | 22.265 | 1.48032 | 1.48272 | 1.48677 | L131 |
| 8 | −361.804 | 87.000 | 1.00000 | 1.00000 | 1.00000 | |
| 9 | ∞ | −544.308 | −1.00000 | −1.00000 | −1.00000 | FM11 |
| 10 | −478.242 | −32.566 | −1.48032 | −1.48272 | −1.48677 | L141 |
| 11 | 319.098 | −2.928 | −1.00000 | −1.00000 | −1.00000 | |
| 12 | 315.584 | −18.000 | −1.46671 | −1.46964 | −1.47456 | L151 |
| 13 | 2137.264 | −2.000 | −1.00000 | −1.00000 | −1.00000 | |
| 14 | −531.834 | −18.000 | −1.46671 | −1.46964 | −1.47456 | L161 |
| 15 | −328.624 | −24.987 | −1.00000 | −1.00000 | −1.00000 | |
| 16 | 333.432 | −35.973 | −1.46671 | −1.46964 | −1.47456 | L171 |
| 17 | 441.158 | −216.544 | −1.00000 | −1.00000 | −1.00000 | |
| 18 | 1846.398 | 216.544 | 1.00000 | 1.00000 | 1.00000 | CCM1 |
| 19 | 441.158 | 35.973 | 1.46671 | 1.46964 | 1.47456 | L171 |
| 20 | 333.432 | 24.987 | 1.00000 | 1.00000 | 1.00000 | |
| 21 | −328.624 | 18.000 | 1.46671 | 1.46964 | 1.47456 | L161 |
| 22 | −531.834 | 2.000 | 1.00000 | 1.00000 | 1.00000 | |
| 23 | 2137.264 | 18.000 | 1.46671 | 1.46964 | 1.47456 | L151 |
| 24 | 315.584 | 2.928 | 1.00000 | 1.00000 | 1.00000 | |
| 25 | 319.098 | 32.566 | 1.48032 | 1.48272 | 1.48677 | L141 |
| 26 | −478.242 | 544.308 | 1.00000 | 1.00000 | 1.00000 | |
| 27 | ∞ | −90.000 | −1.00000 | −1.00000 | −1.00000 | FM21 |
| 28 | 600.279 | −20.000 | −1.48032 | −1.48272 | −1.48677 | L181 |
| 29 | −578.059 | −106.109 | −1.00000 | −1.00000 | −1.00000 | |
| 30 | −1193.741 | −31.322 | −1.46671 | −1.46964 | −1.47456 | L191 |
| 31 | 395.773 | −2.000 | −1.00000 | −1.00000 | −1.00000 | |
| 32 | −416.473 | −31.993 | −1.46671 | −1.46964 | −1.47456 | L201 |
| 33 | ∞ | −3.466 | −1.00000 | −1.00000 | −1.00000 | |
| 34 | ∞ | −22.000 | −1.48032 | −1.48272 | −1.48677 | L211 |
| 35 | −619.461 | −158.343 | −1.00000 | −1.00000 | −1.00000 | |

When rms values of wavefront aberration at the respective wavelengths (g-line, h-line, and i-line) are defined as Wrms(g), Wrms(h), and Wrms(i), values thereof at respective image heights are presented below.

| Image height (mm) | Wrms (g) | Wrms (h) | Wrms (i) |
|---|---|---|---|
| 46.5 | 5.0 mλ | 3.4 mλ | 4.8 mλ |
| 63.0 | 5.1 mλ | 3.5 mλ | 5.8 mλ |
| 79.5 | 5.5 mλ | 6.8 mλ | 6.7 mλ |
| 96.0 | 8.9 mλ | 9.4 mλ | 12.7 mλ |

It is confirmed that the projection optical system in this Example 1 is well compensated for the wavefront aberrations at the respective wavelengths.

Example 2

The below presents values of the specifications of the catadioptric system PL2 in Example 2.

(Specifications)

Numerical aperture (NA) on the object side (glass substrate side): 0.056

Projection magnification: 2

Values corresponding to the condition:

Focal length FPG1 of the first lens unit=707 mm

Focal length FPG3 of the third lens unit=1649 mm $$|FPG3/FPG1| = 1649/707$$
$$= 2.3$$

TABLE 2

(Specifications of optical members)

| | r | d | n(g) | n(h) | n(i) | |
|---|---|---|---|---|---|---|
| 0 | | 41.235 | 1.00000 | 1.00000 | 1.00000 | |
| 1 | −306.121 | 45.000 | 1.48032 | 1.48272 | 1.48677 | L102 |
| 2 | −327.412 | 3.177 | 1.00000 | 1.00000 | 1.00000 | |
| 3 | −322.670 | 45.000 | 1.46671 | 1.46964 | 1.47456 | L112 |
| 4 | 613.094 | 5.986 | 1.00000 | 1.00000 | 1.00000 | |
| 5 | 1676.049 | 35.548 | 1.48032 | 1.48272 | 1.48677 | L122 |
| 6 | −224.580 | 6.992 | 1.00000 | 1.00000 | 1.00000 | |
| 7 | −181.457 | 20.000 | 1.46671 | 1.46964 | 1.47456 | L132 |
| 8 | −310.107 | 2.000 | 1.00000 | 1.00000 | 1.00000 | |
| 9 | ∞ | 25.330 | 1.48032 | 1.48272 | 1.48677 | L142 |
| 10 | −268.581 | 90.000 | 1.00000 | 1.00000 | 1.00000 | |
| 11 | ∞ | −214.629 | −1.00000 | −1.00000 | −1.00000 | FM12 |
| 12 | −1116.037 | −45.000 | −1.46671 | −1.46964 | −1.47456 | L152 |
| 13 | −330.715 | −22.158 | −1.00000 | −1.00000 | −1.00000 | |
| 14 | −367.124 | −45.000 | −1.48032 | −1.48272 | −1.48677 | L162 |
| 15 | 409.133 | −2.000 | −1.00000 | −1.00000 | −1.00000 | |
| 16 | 548.409 | −45.000 | −1.46671 | −1.46964 | −1.47456 | L172 |
| 17 | −570.461 | −5.736 | −1.00000 | −1.00000 | −1.00000 | |
| 18 | −913.519 | −45.000 | −1.48032 | −1.48272 | −1.48677 | L182 |
| 19 | 1946.161 | −330.406 | −1.00000 | −1.00000 | −1.00000 | |
| 20 | 1719.098 | 330.406 | 1.00000 | 1.00000 | 1.00000 | CCM2 |
| 21 | 1946.161 | 45.000 | 1.48032 | 1.48272 | 1.48677 | L182 |
| 22 | −913.519 | 5.736 | 1.00000 | 1.00000 | 1.00000 | |
| 23 | −570.461 | 45.000 | 1.46671 | 1.46964 | 1.47456 | L172 |
| 24 | 548.409 | 2.000 | 1.00000 | 1.00000 | 1.00000 | |
| 25 | 409.133 | 45.000 | 1.48032 | 1.48272 | 1.48677 | L162 |
| 26 | −367.124 | 22.158 | 1.00000 | 1.00000 | 1.00000 | |
| 27 | −330.715 | 45.000 | 1.46671 | 1.46964 | 1.47456 | L152 |
| 28 | −1116.037 | 214.629 | 1.00000 | 1.00000 | 1.00000 | |
| 29 | ∞ | −95.000 | −1.00000 | −1.00000 | −1.00000 | FM22 |
| 30 | 406.592 | −20.000 | −1.48032 | −1.48272 | −1.48677 | L192 |
| 31 | −672.444 | −117.758 | −1.00000 | −1.00000 | −1.00000 | |
| 32 | 570.508 | −45.000 | −1.46671 | −1.46964 | −1.47456 | L202 |
| 33 | 394.103 | −2.000 | −1.00000 | −1.00000 | −1.00000 | |
| 34 | −642.658 | −50.000 | −1.59415 | −1.60086 | −1.61279 | L212 |
| 35 | −475.934 | −3.880 | −1.00000 | −1.00000 | −1.00000 | |
| 36 | −503.152 | −50.000 | −1.60329 | −1.60769 | −1.61517 | L222 |
| 37 | 1079.099 | −302.907 | −1.00000 | −1.00000 | −1.00000 | |

When rms values of wavefront aberration at the respective wavelengths (g-line, h-line, and i-line) are defined as Wrms(g), Wrms(h), and Wrms(i), values thereof at respective image heights are presented below.

| Image height (mm) | Wrms (g) | Wrms (h) | Wrms (i) |
|---|---|---|---|
| 56.0 | 6.1 mλ | 7.1 mλ | 5.9 mλ |
| 75.7 | 6.5 mλ | 7.1 mλ | 6.2 mλ |
| 95.3 | 6.0 mλ | 6.3 mλ | 7.7 mλ |
| 115.0 | 14.6 mλ | 17.3 mλ | 25.3 mλ |

It is confirmed that the projection optical system in this Example 2 is well compensated for the wavefront aberrations at the respective wavelengths.

Example 3

The below presents values of the specifications of the catadioptric system PL3 in Example 3.
(Specifications)
Numerical aperture (NA) on the object side (glass substrate side): 0.085
Projection magnification: 1.25
Values corresponding to the condition:
Focal length FPG1 of the first lens unit=741.7 mm
Focal length FPG3 of the third lens unit=861.1 mm $$|FPG3/FPG1| = 861.1/741.7$$
$$= 1.2$$

TABLE 3

(Specifications of optical members)

| | r | d | n(g) | n(h) | n(i) | |
|---|---|---|---|---|---|---|
| 0 | | 45.154 | 1.00000 | 1.00000 | 1.00000 | |
| 1 | ∞ | 20.799 | 1.48032 | 1.48272 | 1.48677 | L103 |
| 2 | −226.224 | 4.715 | 1.00000 | 1.00000 | 1.00000 | |
| 3 | −196.402 | 15.000 | 1.46671 | 1.46964 | 1.47456 | L113 |
| 4 | 588.156 | 30.699 | 1.00000 | 1.00000 | 1.00000 | |
| 5 | 859.140 | 40.000 | 1.48032 | 1.48272 | 1.48677 | L123 |
| 6 | −274.898 | 90.000 | 1.00000 | 1.00000 | 1.00000 | |
| 7 | ∞ | −347.770 | −1.00000 | −1.00000 | −1.00000 | FM13 |
| 8 | −398.508 | −28.365 | −1.48032 | −1.48272 | −1.48677 | L143 |
| 9 | 303.613 | −2.962 | −1.00000 | −1.00000 | −1.00000 | |
| 10 | 299.514 | −18.000 | −1.46671 | −1.46964 | −1.47456 | L153 |
| 11 | 2214.264 | −2.000 | −1.00000 | −1.00000 | −1.00000 | |
| 12 | −866.521 | −18.000 | −1.46671 | −1.46964 | −1.47456 | L163 |
| 13 | −312.592 | −24.341 | −1.00000 | −1.00000 | −1.00000 | |
| 14 | 247.189 | −70.000 | −1.46671 | −1.46964 | −1.47456 | L173 |
| 15 | 294.614 | −172.194 | −1.00000 | −1.00000 | −1.00000 | |
| 16 | 1167.379 | 172.194 | 1.00000 | 1.00000 | 1.00000 | CCM31 |
| 17 | 294.614 | 70.000 | 1.46671 | 1.46964 | 1.47456 | L173 |
| 18 | 247.189 | 24.341 | 1.00000 | 1.00000 | 1.00000 | |
| 19 | −312.592 | 18.000 | 1.46671 | 1.46964 | 1.47456 | L163 |
| 20 | −866.521 | 2.000 | 1.00000 | 1.00000 | 1.00000 | |
| 21 | 2214.264 | 18.000 | 1.46671 | 1.46964 | 1.47456 | L153 |
| 22 | 299.514 | 2.962 | 1.00000 | 1.00000 | 1.00000 | |
| 23 | 303.613 | 28.365 | 1.48032 | 1.48272 | 1.48677 | L143 |
| 24 | −398.508 | 347.770 | 1.00000 | 1.00000 | 1.00000 | |
| 25 | ∞ | −180.018 | −1.00000 | −1.00000 | −1.00000 | FM23 |
| 26 | −334.868 | −20.056 | −1.46671 | −1.46964 | −1.47456 | L183 |
| 27 | ∞ | −2.000 | −1.00000 | −1.00000 | −1.00000 | |
| 28 | −348.889 | −20.000 | −1.46671 | −1.46964 | −1.47456 | L193 |
| 29 | −191.372 | −4.275 | −1.00000 | −1.00000 | −1.00000 | |
| 30 | −205.694 | −20.000 | −1.48032 | −1.48272 | −1.48677 | L203 |
| 31 | −318.094 | −54.176 | −1.00000 | −1.00000 | −1.00000 | |
| 32 | ∞ | −45.154 | −1.00000 | −1.00000 | −1.00000 | FS |
| 33 | ∞ | −20.799 | −1.48032 | −1.48272 | −1.48677 | |
| 34 | 226.224 | −4.715 | −1.00000 | −1.00000 | −1.00000 | |
| 35 | 196.402 | −15.000 | −1.46671 | −1.46964 | −1.47456 | |
| 36 | −588.156 | −30.699 | −1.00000 | −1.00000 | −1.00000 | |
| 37 | −859.140 | −40.000 | −1.48032 | −1.48272 | −1.48677 | |
| 38 | 274.898 | −90.000 | −1.00000 | −1.00000 | −1.00000 | |
| 39 | ∞ | 347.770 | 1.00000 | 1.00000 | 1.00000 | FM33 |
| 40 | 398.508 | 28.365 | 1.48032 | 1.48272 | 1.48677 | |
| 41 | −303.613 | 2.962 | 1.00000 | 1.00000 | 1.00000 | |
| 42 | −299.514 | 18.000 | 1.46671 | 1.46964 | 1.47456 | |
| 43 | −2214.264 | 2.000 | 1.00000 | 1.00000 | 1.00000 | |
| 44 | 866.521 | 18.000 | 1.46671 | 1.46964 | 1.47456 | |
| 45 | 312.592 | 24.341 | 1.00000 | 1.00000 | 1.00000 | |
| 46 | −247.189 | 70.000 | 1.46671 | 1.46964 | 1.47456 | |
| 47 | −294.614 | 172.194 | 1.00000 | 1.00000 | 1.00000 | |

TABLE 3-continued (Specifications of optical members)

| | r | d | n(g) | n(h) | n(i) | |
|---|---|---|---|---|---|---|
| 48 | −1167.379 | −172.194 | −1.00000 | −1.00000 | −1.00000 | CCM32 |
| 49 | −294.614 | −70.000 | −1.46671 | −1.46964 | −1.47456 | |
| 50 | −247.189 | −24.341 | −1.00000 | −1.00000 | −1.00000 | |
| 51 | 312.592 | −18.000 | −1.46671 | −1.46964 | −1.47456 | |
| 52 | 866.521 | −2.000 | −1.00000 | −1.00000 | −1.00000 | |
| 53 | −2214.264 | −18.000 | −1.46671 | −1.46964 | −1.47456 | |
| 54 | −299.514 | −2.962 | −1.00000 | −1.00000 | −1.00000 | |
| 55 | −303.613 | −28.365 | −1.48032 | −1.48272 | −1.48677 | |
| 56 | 398.508 | −347.770 | −1.00000 | −1.00000 | −1.00000 | |
| 57 | ∞ | 180.018 | 1.00000 | 1.00000 | 1.00000 | FM43 |
| 58 | 334.868 | 20.056 | 1.46671 | 1.46964 | 1.47456 | |
| 59 | ∞ | 2.000 | 1.00000 | 1.00000 | 1.00000 | |
| 60 | 348.889 | 20.000 | 1.46671 | 1.46964 | 1.47456 | |
| 61 | 191.372 | 4.275 | 1.00000 | 1.00000 | 1.00000 | |
| 62 | 205.694 | 20.000 | 1.48032 | 1.48272 | 1.48677 | |
| 63 | 318.094 | 54.191 | 1.00000 | 1.00000 | 1.00000 | |

When rms values of wavefront aberration at the respective wavelengths (g-line, h-line, and i-line) are defined as Wrms(g), Wrms(h), and Wrms(i), values thereof at respective image heights are presented below.

| Image height (mm) | Wrms (g) | Wrms (h) | Wrms (i) |
|---|---|---|---|
| 40.0 | 7.1 mλ | 5.6 mλ | 5.0 mλ |
| 53.3 | 11.5 mλ | 3.3 mλ | 12.6 mλ |
| 66.7 | 8.2 mλ | 4.5 mλ | 14.1 mλ |
| 80.0 | 21.3 mλ | 24.7 mλ | 13.9 mλ |

It is confirmed that the projection optical system in this Example 3 is well compensated for the wavefront aberrations at the respective wavelengths.

Industrial Applicability

The present invention is suitably applicable to the projection optical systems for projecting the image of the mask, the reticle, or the like onto the substrate or the like, the exposure apparatus with the projection optical systems, the exposure method using the exposure apparatus, the display manufacturing method using the exposure apparatus, the mask, and the mask manufacturing method.

What is claimed:

1. An exposure apparatus which performs projection exposure of a pattern provided on a first object onto a second object, while moving the first object and the second object along a scanning direction, the exposure apparatus comprising:
  a first projection optical system and a second projection optical system which are arranged at a predetermined interval along a non-scanning direction intersecting with the scanning direction so that the first and second projection optical systems are adjacent to each other, each of the first and second projection optical systems having an enlargement magnification;
  a first stage which holds the first object and is movable in the scanning direction and the non-scanning direction, the first object having a first pattern region and a second pattern region which are provided at a predetermined interval along the non-scanning direction and a third pattern region provided between the first pattern region and the second pattern region;
  a second stage which holds the second object and is movable; and
  a control unit which controls movements of the first stage and the second stage, wherein the control unit performs a control including:
- moving the first stage and the second stage so that the first projection optical system performs the projection exposure of an enlargement image of the first pattern region onto a first region of the second object and the second projection optical system performs the projection exposure of an enlargement image of the second pattern region onto a second region of the second object, the second region being disposed at the predetermined interval from the first region along the non-scanning direction; and
- moving the first stage and the second stage with respect to at least the non-scanning direction so that the first projection optical system or the second projection optical system performs the projection exposure of an enlargement image of the third pattern region onto a third region of the second object, the third region being a region between the first region onto which the projection exposure of the enlargement image of the first pattern region is performed and the second region onto which the projection exposure of the enlargement image of the second pattern region is performed.

2. The exposure apparatus according to claim 1, wherein the control unit performs the control including:
moving the first stage and the second stage along the scanning direction while the first projection optical system projects the enlargement image of the first pattern region onto the first region and the second projection optical system projects the enlargement image of the second pattern region onto the second region; and
moving the first stage and the second stage along the scanning direction while the first projection optical system or the second projection optical system projects the enlargement image of the third pattern region onto the third region.

3. The exposure apparatus according to claim 1, wherein the control unit performs the control including:
letting the first projection optical system or the second projection optical system be capable of projecting the enlargement image of the third pattern region onto the third region, by moving positions with respect to the non-scanning direction of the first stage and the second stage, after moving the first stage and the second stage along the scanning direction while the first projection optical system projects the enlargement image of the first pattern region onto the first region and the second projection optical system projects the enlargement image of the second pattern region onto the second region.

4. The exposure apparatus according to claim 1, wherein the control unit performs the control including:
moving the first and second stages along the scanning direction, at a speed ratio according to the enlargement magnification of the first and second projection optical systems.

5. The exposure apparatus according to claim 1, wherein the control unit performs the control including:
moving positions with respect to the non-scanning direction of the first and second stages, at a movement distance ratio according to the enlargement magnification of the first and second projection optical systems.

6. The exposure apparatus according to claim 1, wherein the enlargement image of the third pattern region is projected onto the third region so that part of the enlargement image thereof overlaps the first region and the second region, the first region being a region onto which the projection exposure of the enlargement image of the first pattern region is performed, the second region being a region onto which the projection exposure of the enlargement image of the second pattern region is performed.

7. The exposure apparatus according to claim 1, wherein the predetermined interval is equal to a distance of two times an effective exposure width with respect to the second object, the effective exposure width being defined as a width along the non-scanning direction of the first projection optical system and the second projection optical system.

8. The exposure apparatus according to claim 1, wherein each of the first projection optical system and the second projection optical system comprises at least one catadioptric system which projects an elongation image of the pattern provided on the first object onto the second object,
the catadioptric system comprises:
- a concave reflecting mirror disposed in an optical path between a first plane and a second plane;
- a first lens unit disposed in an optical path between the first plane and the concave reflecting mirror and having a positive refracting power;
- a first path deflecting surface disposed in an optical path between the first lens unit and the concave reflecting mirror and adapted to deflect the optical path;
- a second lens unit disposed in an optical path between the first path deflecting surface and the concave reflecting mirror;
- a second path deflecting surface disposed in an optical path between the second lens unit and the second plane and adapted to deflect the optical path; and
- a third lens unit disposed in an optical path between the second path deflecting surface and the second plane and having a positive refracting power, and the projection optical system satisfies the following condition:

$$1<FPG3/FPG1<2.5,$$

where FPG1 is a focal length of the first lens unit and FPG3 is a focal length of the third lens unit.

9. The exposure apparatus according to claim 8 wherein the first lens unit comprises first and second positive lenses, and
the third lens unit comprises third and fourth positive lenses.

10. The exposure apparatus according to claim 8, wherein the second lens unit comprises at least one negative lens and one positive lens.

11. The exposure apparatus according to claim 8, wherein the third lens unit comprises a negative lens disposed nearest to the second path deflecting surface.

12. The exposure apparatus according to claim 8, wherein each of the first projection optical system and the second projection optical system comprises a pair of the catadioptric systems.

13. An exposure apparatus according to claim 1, wherein the second object is a photosensitive substrate having an outside diameter of larger than 500 mm.

14. A display manufacturing method comprising:
an exposure step of effecting exposure of an enlargement image of a pattern formed on a mask, on a photosensitive substrate, using the exposure apparatus as set forth in claim 1; and
a development step of developing the photosensitive substrate exposed in the exposure step.

15. An exposure method that performs projection exposure of a pattern provided on a first object onto a second object, while moving the first object and the second object along a scanning direction, the exposure method comprising:
- preparing the first object which has a first pattern region and a second pattern region provided at a predetermined interval along a non-scanning direction intersecting with the scanning direction and a third pattern region provided between the first pattern region and the second region;
- moving a first stage and a second stage so that a first projection optical system performs the projection exposure of an enlargement image of the first pattern region onto a first region of the second object and a second projection optical system performs the projection exposure of an enlargement image of the second pattern region onto a second region of the second object, the second region being disposed at the predetermined interval from the first region along the non-scanning direction; and
- moving the first stage and the second stage with respect to at least the non-scanning direction so that the first projection optical system or the second projection optical system performs the projection exposure of an enlargement image of the third pattern region onto a third region of the second object, the third region being a region between the first region onto which the projection exposure of the enlargement image of the first pattern region is performed and the second region onto which the projection exposure of the enlargement image of the second pattern region is performed.

16. The exposure method according to claim 15, including:
- moving the first stage and the second stage along the scanning direction while the first projection optical system projects the enlargement image of the first pattern region onto the first region and the second projection optical system projects the enlargement image of the second pattern region onto the second region; and
- moving the first stage and the second stage along the scanning direction while the first projection optical system or the second projection optical system projects the enlargement image of the third pattern region onto the third region.

17. The exposure method according to claim 15, including:
- letting the first projection optical system or the second projection optical system be capable of projecting the enlargement image of the third pattern region onto the third region, by moving positions with respect to the non-scanning direction of the first stage and the second stage, after moving the first stage and the second stage along the scanning direction while the first projection optical system projects the enlargement image of the first pattern region onto the first region and the second projection optical system projects the enlargement image of the second pattern region onto the second region.

18. The exposure method according to claim 15, including:
- moving the first and second stages along the scanning direction, at a speed ratio according to the enlargement magnification of the first and second projection optical systems.

19. The exposure method according to claim 15, including:
- moving positions with respect to the non-scanning direction of the first and second stages, at a movement distance ratio according to the enlargement magnification of the first and second projection optical systems.

20. The exposure method according to claim 15, including:
- the enlargement image of the third pattern region is projected onto the third region so that part of the enlargement image thereof overlaps the first region and the second region, the first region being a region onto which the projection exposure of the enlargement image of the first pattern region is performed, the second region being a region onto which the projection exposure of the enlargement image of the second pattern region is performed.

21. The exposure method according to claim 15, including:
- the predetermined interval is equal to a distance of twice an effective exposure width with respect to the second object, the effective exposure width being defined as a width along the non-scanning direction of the first projection optical system and the second projection optical system.

22. The exposure method according to claim 15, wherein the second object is a photosensitive substrate having an outer diameter of larger than 500 mm.

23. A display manufacturing method comprising:
- an exposure step of effecting exposure of an enlargement image of a pattern formed on a mask, on a photosensitive substrate, using the exposure method as set forth in claim 15; and
- a development step of developing the photosensitive substrate exposed in the exposure step.

* * * * *